(12) United States Patent
Abdo

(10) Patent No.: US 10,944,362 B2
(45) Date of Patent: Mar. 9, 2021

(54) COUPLING SURFACE ACOUSTIC WAVE RESONATORS TO A JOSEPHSON RING MODULATOR

(71) Applicant: International Business Machines Corporation, Armonk, NY (US)

(72) Inventor: Baleegh Abdo, Fishkill, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/048,935

(22) Filed: Jul. 30, 2018

(65) Prior Publication Data

US 2020/0036330 A1   Jan. 30, 2020

(51) Int. Cl.
*H03D 7/00* (2006.01)
*H01L 39/22* (2006.01)
(Continued)

(52) U.S. Cl.
CPC .............. *H03D 7/005* (2013.01); *H01F 6/06* (2013.01); *H01L 39/025* (2013.01); *H01L 39/223* (2013.01); *H01L 39/2493* (2013.01); *H03H 9/02551* (2013.01); *H03H 9/02559* (2013.01); *H03H 9/02566* (2013.01); *H03H 9/02685* (2013.01); *H03H 9/25* (2013.01); *H03H 9/72* (2013.01)

(58) Field of Classification Search
CPC ........... H03D 7/005; H03H 9/25; G06N 10/00
See application file for complete search history.

(56) References Cited

U.S. PATENT DOCUMENTS 5,837,332 A   11/1998   Takahashi et al.
6,005,446 A   12/1999   Galani et al.
(Continued)

FOREIGN PATENT DOCUMENTS

EP       1035648 A2    9/2000
WO    2008006089 A2    1/2008
(Continued)

OTHER PUBLICATIONS

Frattini et al., "3-wave mixing Josephson dipole element," Applied Physics Letters, 2017, vol. 110, Issue 22, ID 222603, American Institute of Physics, 5 pages.
(Continued)

*Primary Examiner* — Lincoln D Donovan
*Assistant Examiner* — Colleen J O Toole
(74) *Attorney, Agent, or Firm* — Amin, Turocy & Watson, LLP

(57) ABSTRACT

A superconducting device that mixes surface acoustic waves and techniques for fabricating the same are provided. A superconducting device can comprise a first surface acoustic wave resonator comprising a first low-loss piezo-electric dielectric substrate. The superconducting device can also comprise a second surface acoustic wave resonator comprising a second low-loss piezo-electric dielectric substrate. Further, the superconducting device can comprise a Josephson ring modulator coupled to the first surface acoustic wave resonator and the second surface acoustic wave resonator. The Josephson ring modulator is a dispersive nonlinear three-wave mixing element.

25 Claims, 10 Drawing Sheets

(51) Int. Cl.
  H03H 9/25    (2006.01)
  H01F 6/06    (2006.01)
  H01L 39/02   (2006.01)
  H01L 39/24   (2006.01)
  H03H 9/02    (2006.01)
  H03H 9/72    (2006.01)

(56) References Cited

U.S. PATENT DOCUMENTS

| | | | |
|---|---|---|---|
| 6,563,310 | B2 | 5/2003 | Zagoskin |
| 6,797,338 | B2 | 9/2004 | Saitoh et al. |
| 6,900,454 | B2 | 5/2005 | Blais et al. |
| 7,724,083 | B2 | 5/2010 | Herring et al. |
| 7,932,514 | B2 | 4/2011 | Farinelli et al. |
| 8,111,083 | B1 | 2/2012 | Pesetski et al. |
| 8,508,280 | B2 | 8/2013 | Naaman et al. |
| 8,878,626 | B2 | 11/2014 | Zmuidzinas et al. |
| 8,954,125 | B2 | 2/2015 | Corcoles Gonzalez et al. |
| 9,153,764 | B2 | 10/2015 | Colli |
| 9,260,289 | B2 | 2/2016 | Park |
| 9,350,460 | B2 | 5/2016 | Paik |
| 9,379,303 | B2 | 6/2016 | Gambetta et al. |
| 9,461,588 | B1 | 10/2016 | Naaman et al. |
| 9,548,742 | B1 * | 1/2017 | Abdo ............... H03K 3/38 |
| 9,627,045 | B1 | 4/2017 | Mukhanov et al. |
| 9,680,452 | B1 | 6/2017 | Abdo |
| 9,697,473 | B2 | 7/2017 | Abdo |
| 9,768,771 | B2 | 9/2017 | Naaman |
| 9,806,711 | B1 | 10/2017 | Abdo |
| 9,843,312 | B2 | 12/2017 | Abdo |
| 9,858,532 | B2 | 1/2018 | Abdo |
| 9,906,206 | B2 | 2/2018 | Shih et al. |
| 9,948,254 | B2 | 4/2018 | Narla et al. |
| 10,014,859 | B2 | 7/2018 | Abdo |
| 10,062,829 | B1 | 8/2018 | Abdo |
| 10,068,184 | B1 | 9/2018 | Hertzberg et al. |
| 10,074,793 | B2 | 9/2018 | Abdo |
| 10,097,143 | B2 | 10/2018 | Abdo |
| 10,103,730 | B1 | 10/2018 | Abdo |
| 10,236,432 | B2 | 3/2019 | Abdo |
| 10,320,331 | B1 | 6/2019 | Abdo |
| 10,348,245 | B1 | 7/2019 | Abdo |
| 10,396,782 | B2 | 8/2019 | Abdo |
| 2002/0036549 | A1 | 3/2002 | Matsuda et al. |
| 2016/0308502 | A1 | 10/2016 | Abdo et al. |
| 2017/0091648 | A1 | 3/2017 | Abdo |
| 2017/0104695 | A1 | 4/2017 | Naaman |
| 2017/0199036 | A1 | 7/2017 | Moxley, III |
| 2017/0229633 | A1 | 8/2017 | Abdo |
| 2017/0250673 | A1 | 8/2017 | Ruby et al. |
| 2018/0069288 | A1 | 3/2018 | Minev et al. |
| 2018/0113373 | A1 | 4/2018 | Witmer et al. |
| 2019/0013458 | A1 * | 1/2019 | Hill ............... H01L 41/187 |

FOREIGN PATENT DOCUMENTS

| | | | |
|---|---|---|---|
| WO | 2016138406 | A1 | 9/2016 |
| WO | 2016168642 | A1 | 10/2016 |

OTHER PUBLICATIONS

Noguchi et al., "Qubit-assisted transduction for a detection of surface acoustic waves near the quantum limit," Oct. 2017, arXiv:1710.00467v1, 10 pages.
Moores et al., "Cavity quantum acoustic device in the multimode strong coupling regime," Nov. 2017, arXiv:1711.05913v1, Joint Institute for Laboratory Astrophysics, National Institute of Standards and Technology and the University of Colorado, 12 pages.
Magnusson et al., "Quantum Surface Acoustics," Applied Physics Letters, 2015, vol. 106, Issue 6, ID 063509, 4 pages.
Ekstrom et al., "Surface acoustic wave unidirectional transducers for quantum applications," Applied Physics Letters, 2017, vol. 110, ID 073105, AIP Publishing, 4 pages.
Gustafsson et al., "Propagating phonons coupled to an artificial atom," Science, Oct. 2014, vol. 346, Issue 6206, pp. 207-211, 6 pages.
Manenti et al., "Circuit quantum acoustodynamics with surface acoustic waves," Nature Communications, vol. 8, No. 975, 6 pages.
Bolgar et al., "Experimental demonstration of a two-dimensional phonon cavity in the quantum regime," 2017, arxiv:1710.06476, 7 pages.
Abdo et al., "Nondegenerate three-wave mixing with the Josephson ring modulator," Physical Review B, 2013, vol. 87, ID 014508, American Physical Society, 18 pages.
Abdo et al., "Josephson amplifier for qubit readout," Applied Physics Letters, 2011, vol. 99, ID 162506, American Institute of Physics, 4 pages.
Pillet et al., "A compact design for the Josephson mixer: The lumped element circuit," Applied Physics Letters, Jun. 2015, vol. 106, ID 222603, AIP Publishing, 7 pages.
Bergeal et al., "Phase preserving amplification near the quantum limit with a Josephson Ring Modulator," Dec. 2009, arXiv:0912.3407v1, 20 pages.
Bergeal et al., "Analog information processing at the quantum limit with a Josephson ring modulator," Nature Physics, Feb. 2010, Macmillan Publishers Limited, 7 pages.
Gu et al., "Microwave photonics with superconducting quantum circuits," Oct. 2017, arXiv:1707.02046v2, 170 pages. https://arxiv.org/pdf/1707.02046.pdf.
Abdo et al.,"Directional Amplification with a Josephson Circuit," Physical Review X, 2013, vol. 3, Issue 3, ID 031001, American Physical Society, 8 pages.
Notice of Allowance received for U.S. Appl. No. 16/049,006 dated Feb. 28, 2019, 25 pages.
Notice of Allowance received for U.S. Appl. No. 16/048,979 dated Jan. 24, 2019, 26 pages.
List of IBM Patents or Applications Treated as Related.
Partial International Search Report and Written Opinion for International Application Serial No. PCT/EP2019/070100 dated Nov. 27, 2029, 17 pages.
Non-Final Office Action received for U.S. Appl. No. 16/385,667 dated Nov. 7, 2019, 20 pages.
Non-Final Office Action received for U.S. Appl. No. 16/358,277 dated Oct. 24, 2019, 23 pages.
Non-Final Office Action received for U.S. Appl. No. 16/048,992 dated Dec. 23, 2019, 60 pages.
International Search Report and Written Opinion for International Application Serial No. PCT/EP2019/070101 dated Oct. 29, 2019, 15 pages.
International Search Report and Written Opinion for International Application Serial No. PCT/EP2019/070103 dated Oct. 29, 2019, 15 pages.
International Search Report and Written Opinion for International Application Serial No. PCT/EP2019/070090 dated Feb. 6, 2020, 11 pages.
Aref, et al., "Quantum Acoustics with Surface Acoustic Waves", arxiv.org, Cornell University Library, 201, OLIN Library Cornell University Ithaca, NY 14853, Jun. 4, 2015 (Jun. 4, 2015), XP081345581, DOI: 10.1007/978-3-319-24091-6_9 figures 9, 10.
International Search Report and Written Opinion for International Application Serial No. PCT/EP2019/070100 dated Feb. 21, 2020, 26 pages.

* cited by examiner

COUPLING SURFACE ACOUSTIC WAVE RESONATORS TO A JOSEPHSON RING MODULATOR

BACKGROUND

In quantum circuits, a Josephson ring modulator is coupled to two superconducting microwave resonators and three-way mixing is performed between differential modes supported by the two superconducting microwave resonators and a non-resonant, common drive fed to the Josephson ring modulator. Due to coupling the Josephson ring modulator to the two superconducting microwave resonators, the device is limited in the choice of the frequency of differential modes, which can cause one or more problems. For example, coupling the Josephson ring modulator to low-frequency, transmission-line resonators can have various problems, such as occupying a large area (e.g., a large footprint). Another problem is the relatively large linear inductance associated with the low resonance-frequency transmission-line compared to the inductance of the Josephson ring modulator. This can result in a very reduced participation ratio which in turn requires, for its operation, very high external quality factors (Qs) for the resonators. However, high external Qs for the resonators is undesirable because it can give rise to very narrow dynamical bandwidths, which severely limit the device usability and practicality.

In addition, coupling the Josephson ring modulator to low-frequency, lumped-element resonators can require the use of large lumped capacitances and large lumped inductances. Large lumped capacitances and inductances are difficult to realize in practice. Large capacitances can have considerable loss (lowering the internal Q of the device) and as a result can cause a considerable portion of the quantum signal to be lost. Large geometric inductances usually suffer from parasitic capacitances which limit their utility. Large kinetic inductances usually rely on unconventional thin superconductors which are difficult to fabricate and integrate.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein are devices, systems, methods, computer-implemented methods, apparatuses, and/or computer program products that mix surface acoustic waves.

According to an embodiment, a superconducting device can comprise a first surface acoustic wave resonator comprising a first low-loss piezo-electric dielectric substrate. The superconducting device can also comprise a second surface acoustic wave resonator comprising a second low-loss piezo-electric dielectric substrate. Further, the superconducting device can comprise a Josephson ring modulator coupled to the first surface acoustic wave resonator and the second surface acoustic wave resonator. The Josephson ring modulator can be a dispersive nonlinear three-wave mixing element. An advantage of such a superconducting device is that dissipationless, three-wave mixing and amplification can be performed between microwave frequencies of the first superconducting surface acoustic wave resonator and the second superconducting surface acoustic wave resonator.

In some examples, the first surface acoustic wave resonator can comprise a first superconducting Bragg mirror and a second superconducting Bragg mirror separated from the first superconducting Bragg mirror by a first distance. The second surface acoustic wave resonator can comprise a third superconducting Bragg mirror and a fourth superconducting Bragg mirror separated from the third superconducting Bragg mirror by a second distance. The first distance and the second distance can be odd integer multiples of a half-wavelength supported by the first surface acoustic wave resonator and the second surface acoustic wave resonator. An advantage of such a superconducting device is that the superconducting device can operate over a single, a few, or many modes of the superconducting surface acoustic wave resonators.

According to some implementations, the superconducting device can also advantageously comprise a first external feedline coupled to the first surface acoustic wave resonator through a first interdigitated capacitance device. The first external feedline carries first input signals and first output signals of the first surface acoustic wave resonator. Further, the superconducting device can comprise a second external feedline coupled to the second surface acoustic wave resonator through a second interdigitated capacitance device. The second external feedline carries second input signals and second output signals of the second surface acoustic wave resonator. An advantage of such a superconducting device is that frequencies of the first superconducting surface acoustic wave resonator and the second superconducting surface acoustic wave resonator can be received, mixed, and amplified.

According to an embodiment, provided is a superconducting circuit that can comprise a Josephson ring modulator, a first surface acoustic wave resonator and a second surface acoustic wave resonator. The first surface acoustic wave resonator can be coupled via a first superconducting wire to a first node of the Josephson ring modulator and via a second superconducting wire to a second node of the Josephson ring modulator. The first superconducting wire and the second superconducting wire can comprise a same length. The second surface acoustic wave resonator can be coupled via a third superconducting wire to a third node of the Josephson ring modulator and via a fourth superconducting wire to a fourth node of the Josephson ring modulator. The third superconducting wire and the fourth superconducting wire can comprise a same length. The first surface acoustic wave resonator is spatially and spectrally separated from the second surface acoustic wave resonator. An advantage of such a superconducting circuit is that dissipationless, three-wave mixing and amplification can be facilitated between low microwave frequencies of the first superconducting surface acoustic wave resonator and the second superconducting surface acoustic wave resonator.

In accordance with some implementations, the superconducting circuit can comprise a first external feedline coupled to the first surface acoustic wave resonator through a first interdigitated capacitance device. The first external feedline can carry first input signals and first output signals of the first surface acoustic wave resonator. The superconducting circuit can also comprise a second external feedline coupled to the second surface acoustic wave resonator through a second interdigitated capacitance device. The second external feedline can carry second input signals and second output signals of the second surface acoustic wave resonator. An advantage of such a superconducting circuit is that a first set of frequencies of the first superconducting surface acoustic wave resonator and a second set of frequencies of the second superconducting surface acoustic wave resonator can be received, mixed, and amplified.

Another embodiment relates to a method that can comprise coupling a first superconducting surface acoustic wave resonator to a Josephson ring modulator. The method can also comprise coupling a second superconducting surface acoustic wave resonator to the Josephson ring modulator. The Josephson ring modulator can comprise one or more Josephson junctions arranged in a Wheatstone-bridge configuration. Further, the Josephson ring modulator can be a dispersive nonlinear three-wave mixing element. An advantage of such a method is that a superconducting device can be fabricated, which can perform dissipationless, three-wave mixing between first microwave frequencies of the first superconducting surface acoustic wave resonator and second microwave frequencies of the second superconducting surface acoustic wave resonator.

A further embodiment relates to a superconducting device that can comprise a first superconducting surface acoustic wave resonator comprising a first interdigitated capacitance device positioned at a first center of the first superconducting surface acoustic wave resonator. The first surface acoustic wave resonator can also comprise a first superconducting Bragg mirror and a second superconducting Bragg mirror separated from the first superconducting Bragg mirror by a first distance. The superconducting device can also comprise a second superconducting surface acoustic wave resonator comprising a second interdigitated capacitance device positioned at a second center of the second superconducting surface acoustic wave resonator. The second superconducting surface acoustic wave resonator can also comprise a third superconducting Bragg mirror and a fourth superconducting Bragg mirror separated from the third superconducting Bragg mirror by a second distance. The first distance and the second distance are odd integer multiples of a half-wavelength supported by the first surface acoustic wave resonator and the second surface acoustic wave resonator. Further, the superconducting device can comprise a Josephson ring modulator coupled to the first superconducting surface acoustic wave resonator and the second superconducting surface acoustic wave resonator. A first set of opposite nodes of the Josephson ring modulator can be connected to opposite nodes of the first interdigitated capacitance device. A second set of opposite nodes of the Josephson ring modulator can be connected to opposite nodes of the second interdigitated capacitance device. An advantage of such a superconducting device is that dissipationless, three-wave mixing and amplification can be performed between microwave frequencies of the first superconducting surface acoustic wave resonator and microwave frequencies of the second superconducting surface acoustic wave resonator while occupying a small space and through the use of low-loss resonators.

Another embodiment relates to a superconducting device comprising a first superconducting surface acoustic wave resonator comprising a first superconducting Bragg mirror and a second superconducting Bragg mirror separated from the first superconducting Bragg mirror by a first distance. The superconducting device can also comprise a second superconducting surface acoustic wave comprising a third superconducting Bragg mirror and a fourth superconducting Bragg mirror separated from the third superconducting Bragg mirror by a second distance. The first distance and the second distance are odd integer multiples of a half-wavelength supported by the first surface acoustic wave resonator and the second surface acoustic wave resonator. In addition, the second superconducting surface acoustic wave resonator can be spatially and spectrally separated from the first superconducting surface acoustic wave resonator. Further, the superconducting device can comprise a Josephson ring modulator comprising a first set of opposite nodes and a second set of opposite nodes. The Josephson ring modulator can be connected to the first superconducting surface acoustic wave resonator via the first set of opposite nodes and to the second superconducting surface acoustic wave resonator via the second set of opposite nodes. An advantage of such a superconducting device is that dissipationless, three-wave mixing and amplification can be performed between microwave frequencies of the first superconducting surface acoustic wave resonator and microwave frequencies of the second superconducting surface acoustic wave resonator while occupying a small space through the use of low-loss resonators.

DETAILED DESCRIPTION

Figure 1:
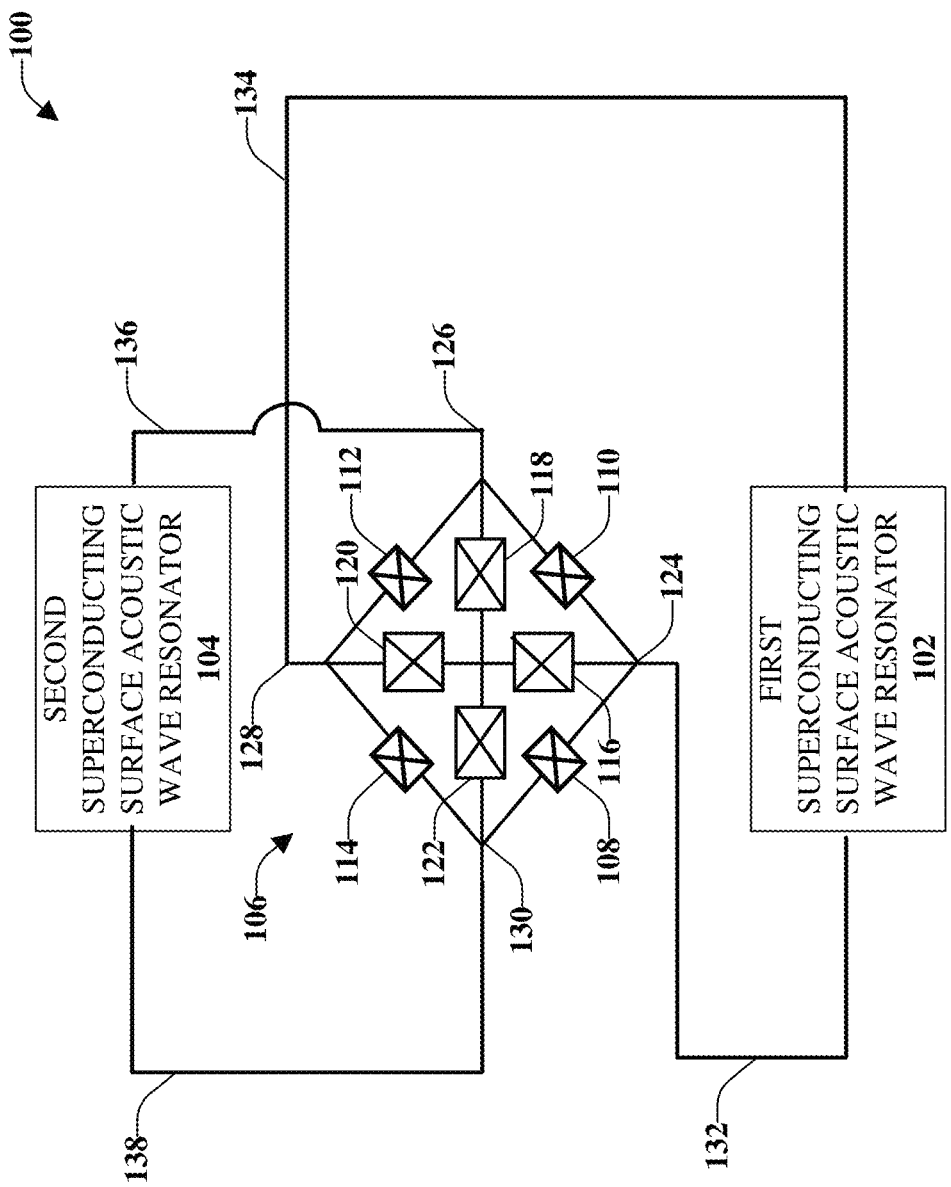
FIG. 1 illustrates an example, non-limiting block diagram of a circuit in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

As it relates to circuits, and more specifically quantum circuits, if a Josephson ring modulator (JRM) is coupled to two superconducting microwave resonators, there is a limitation with respect to the choice of the differential modes that couple to the JRM. For example, a problem associated with coupling the JRM to low-frequency, transmission-line resonators is that a large area is occupied by the device. A solution provided by the superconducting device, the superconducting circuit, and the methods discussed herein is that two superconducting surface acoustic wave resonators are utilized. The superconducting surface acoustic wave resonators are compact as compared to superconducting wave resonators and, therefore, a size of the superconducting device is reduced.

Another problem associated with prior art superconducting devices (e.g., devices that utilize two superconducting microwave resonators) is that the prior art superconducting devices are limited to mixing frequencies between 5 Gigahertz (GHz) and 15 GHz. The various superconducting devices, circuits, and methods discussed herein provide a solution to this problem through the utilization of superconducting surface acoustic wave resonators that enable dissipationless, three-wave mixing and amplification between low microwave frequencies (e.g., about 0.1 GHz to about 4 GHz). Operation at these low microwave frequencies is not available using transmission line resonators or using lumped-elements as provided with prior art superconducting devices.

Given the above problems with prior art superconducting devices, the various aspects provided herein can be implemented to produce a solution to one or more of these problems in the form of a superconducting device, superconducting circuit, and method of fabricating the same. Such systems, devices, circuits, methods, computer-implemented methods, and/or computer program products implementing such a superconducting device can have an advantage of reduced size and low-loss resonators, as compared to conventional techniques.

According to some implementations, the device can function as a Josephson mixer for surface acoustic waves (phonons). Additionally, or alternatively, the device can function as a lossless frequency converter between two surface acoustic waves. Additionally, or alternatively, the device can function as a nondegenerate parametric Josephson amplifier for surface acoustic waves. In additional or alternative implementations, the device can function as an entangler of two phononic modes (e.g., generating entanglement between two phononic modes).

FIG. 1 illustrates an example, non-limiting block diagram of a circuit 100 in accordance with one or more embodiments described herein. The circuit 100 can comprise a first superconducting surface acoustic wave (SAW) resonator (referred to as a first superconducting SAW resonator 102), a second superconducting SAW resonator 104, and a Josephson ring modulator (referred to as a JRM 106).

In a piece of quantum hardware, which includes the superconducting qubits space, a mechanism to implement gate operations or measurements on the quantum hardware is to generate microwave signals or receive microwave signals by the first superconducting SAW resonator 102 and/or the second superconducting SAW resonator 104. As discussed herein, according to some implementations, the circuit 100 can operate as a Josephson mixer between surface acoustic waves (phonons). Further, the circuit 100 can operate as a lossless frequency converter between two surface acoustic waves. In some implementations, the circuit 100 can operate as a nondegenerate parametric Josephson amplifier for surface acoustic waves. In additional and/or alternate implementations, the device can operate as an entangler of two phononic modes.

SAW resonators (e.g., the first superconducting SAW resonator 102, the second superconducting SAW resonator 104) are electro-mechanical resonators for phonons, which can resonate at microwave frequencies of around 0.5 GHz to 5 GHz. Surface acoustic wave resonators (or surface acoustic wave filters) are used in many telecommunication applications (e.g., mobile phones). SAW resonators can also be useful in quantum computing applications and quantum circuits in the microwave domain, as discussed herein. Further, surface acoustic wave resonators can have high internal Quality (Q) factors, which can be in excess of $10^5$. Therefore, SAW resonators can have a very low loss. In addition, SAW resonators are very compact. For example, the surface acoustic resonance wavelengths are very short (e.g., less than 1 micro metre or <1 µm).

The first superconducting SAW resonator 102 can comprise a first resonance frequency and the second superconducting SAW resonator 104 can comprise a second resonance frequency. Further, the first superconducting SAW resonator 102 and the second superconducting SAW resonator 104 can be implemented on respective low-loss piezo-electric dielectric substrates. The low-loss piezo-dielectric substrates can comprise a material selected from a group of materials comprising quartz, gallium arsenide, lithium niobite, and/or zinc oxide, or the like.

The JRM 106 is a device that can be based on Josephson tunnel junctions. For example, the JRM 106 can comprise one or more Josephson junctions arranged in a Wheatstone-bridge configuration. The one or more Josephson junctions can comprise a material selected from a group of materials comprising aluminum and niobium. Further, the JRM 106 can perform non-degenerate mixing in the microwave regime, without losses. According to some implementations, the JRM 106 can be a dispersive nonlinear three-wave mixing element.

The JRM 106 can support two differential modes and two common modes (one of which is at zero frequency, and, therefore, not applicable to the one or more embodiments described herein). By coupling the JRM 106 to a suitable electromagnetic environment (which supports two differential microwave modes), the circuit 100 can be used to perform various quantum processing operations such as lossless frequency conversion in the microwave domain, parametric amplification at the quantum limit (e.g., amplification of quantum signals in the microwave domain), and/or generation of two-mode squeezing.

The Josephson ring modulator (e.g., the JRM 106) can comprise one or more Josephson junctions arranged in a Wheatstone-bridge configuration. The Josephson junctions are illustrated as a first Josephson junction 108, a second Josephson junction 110, a third Josephson junction 112, and a fourth Josephson junction 114. The Josephson junctions (e.g., the first Josephson junction 108, the second Josephson junction 110, the third Josephson junction 112, the fourth Josephson junction 114) can be formed in a loop. Further, the Josephson junctions can be utilized to perform the mixing as discussed herein.

The JRM 106 also can comprise four additional junctions (internal to the loop), which can be shunt junctions according to some implementations. These four additional junctions are labeled as a first internal junction 116, a second internal junction 118, a third internal junction 120, and a fourth internal junction 122. The four internal junctions (e.g., the first internal junction 116, the second internal junction 118, the third internal junction 120, and the fourth internal junction 122) can facilitate tuning of the frequency of the circuit 100. The tunability can be obtained with the application of external magnetic flux. In this configuration, the four internal junctions, which are larger than the junctions on the outer loop, can function as linear inductors shunting the outer Josephson junctions. By threading external flux through the inner loops, the total inductance of the JRM 106 can change, which can lead to a change in the resonance frequencies of the resonator coupled to the JRM 106.

In addition, the configuration of the JRM 106 defines points or nodes where the external junctions meet. Accordingly, there can be a first node 124 at the bottom of the JRM 106; a second node 126 at the right side of the JRM 106; a third node 128 at the top of the JRM 106; and a fourth node 130 at the left side of the JRM 106. It is noted that the terms bottom, right side, top, and left side are for purposes of explaining the disclosed aspects with respect to the figures and the disclosed aspects are not limited to any particular plane or orientation of the JRM 106 and/or the circuit 100 and its associated circuitry.

The four nodes (e.g., the first node 124, the second node 126, the third node 128, and the fourth node 130) can be utilized to define the differential mode and the common mode hosted by the circuit 100. The modes can be orthogonal and do not overlap one another. Further, the nodes, as illustrated, can be physically orthogonal. For example, the first node 124 and the third node 128 are vertical to one another and the second node 126 and the fourth node 130 are horizontal to one another.

The nodes can be utilized to couple the JRM 106 to the first superconducting SAW resonator 102 and to the second superconducting SAW resonator 104. For example, a first set of opposite nodes (e.g., the first node 124 and the third node 128) can be chosen to operatively couple the JRM 106 to the first superconducting SAW resonator 102. The first node 124 can be coupled to the first superconducting SAW resonator 102 via a first superconducting wire 132 (or first lead) and the third node 128 can be coupled to the first superconducting SAW resonator 102 via a second superconducting wire 134 (or second lead).

The second set of opposite nodes (e.g., the second node 126 and the fourth node 130) can be chosen to operatively couple the JRM 106 to the second superconducting SAW resonator 104. For example, the second node 126 can be coupled to the second superconducting SAW resonator 104 via a third superconducting wire 136 (or third lead) and the fourth node 130 can be coupled to the second superconducting SAW resonator 104 via a fourth superconducting wire 138 (or fourth lead).

As illustrated, the first superconducting wire 132 and the second superconducting wire 134 can be coupled to the first superconducting SAW resonator 102 at different locations of the first superconducting SAW resonator 102. Further, the third superconducting wire 136 and the fourth superconducting wire 138 can be coupled to the second superconducting SAW resonator 104 at different locations of the second superconducting SAW resonator 104. Further details related to the coupling locations will be provided below with respect to FIG. 3.

The first superconducting SAW resonator 102, the second superconducting SAW resonator 104, and the JRM 106 are portions of a frequency-converter/mixer/amplifier/entangler device. The device can receive external microwave photons or phonons at microwave frequencies from other quantum devices connected to the SAW port (e.g., an idler port) and/or the SAW port (e.g., a signal port) of the device.

The circuit 100, as well as other aspects discussed herein can be utilized in a device that facilitates manipulation of quantum information in accordance with one or more embodiments described herein. Aspects of devices (e.g., the circuit 100 and the like), systems, apparatuses, or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described.

In various embodiments, the device can be any type of component, machine, system, device, facility, apparatus, and/or instrument that comprises a processor and/or can be capable of effective and/or operative communication with a wired and/or wireless network. Components, machines, apparatuses, systems, devices, facilities, and/or instrumentalities that can comprise the device can include tablet computing devices, handheld devices, server class computing machines and/or databases, laptop computers, notebook computers, desktop computers, cell phones, smart phones, consumer appliances and/or instrumentation, industrial and/or commercial devices, hand-held devices, digital assistants, multimedia Internet enabled phones, multimedia players, and the like.

In various embodiments, the device can be a quantum computing device or quantum computing system associated with technologies such as, but not limited to, quantum circuit technologies, quantum processor technologies, quantum computing technologies, artificial intelligence technologies, medicine and materials technologies, supply chain and logistics technologies, financial services technologies, and/or other digital technologies. The circuit 100 can employ hardware and/or software to solve problems that are highly technical in nature, that are not abstract and that cannot be performed as a set of mental acts by a human. Further, in certain embodiments, some of the processes performed can be performed by one or more specialized computers (e.g., one or more specialized processing units, a specialized computer with a quantum computing component, etc.) to carry out defined tasks related to machine learning.

The device and/or components of the device can be employed to solve new problems that arise through advancements in technologies mentioned above, computer architecture, and/or the like. One or more embodiments of the device can provide technical improvements to quantum computing systems, quantum circuit systems, quantum processor systems, artificial intelligence systems and/or other systems. One or more embodiments of the circuit 100 can also provide technical improvements to a quantum processor (e.g., a superconducting quantum processor) by improving processing performance of the quantum processor, improving processing efficiency of the quantum processor, improving processing characteristics of the quantum processor, improving timing characteristics of the quantum processor, and/or improving power efficiency of the quantum processor.

Figure 2:
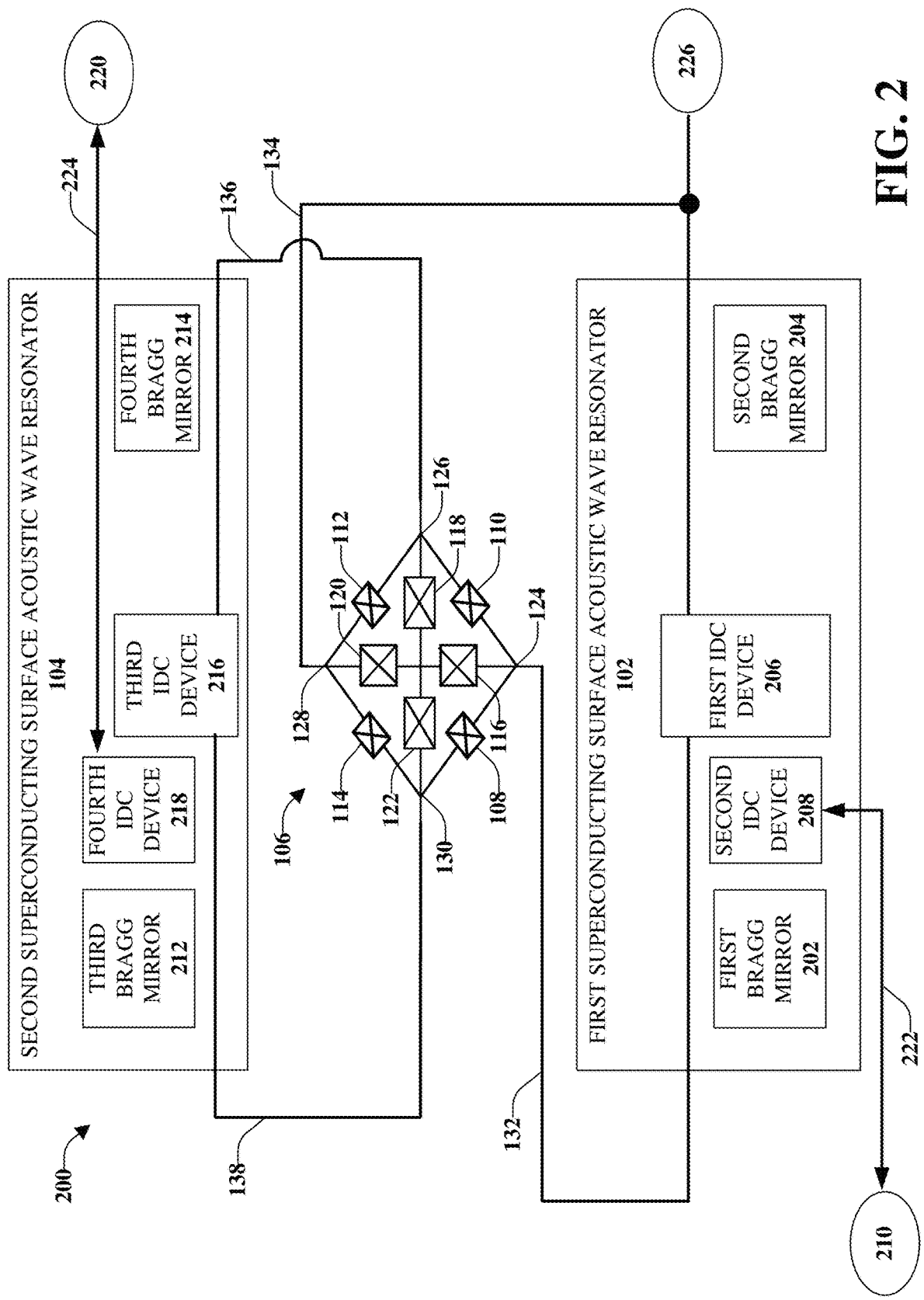
FIG. 2 illustrates an example, non-limiting block diagram of a circuit comprising two superconducting surface acoustic wave resonators in accordance with one or more embodiments described herein.

FIG. 2 illustrates an example, non-limiting block diagram of a circuit 200 comprising two superconducting surface acoustic wave (SAW) resonators in accordance with one or more embodiments described herein. Repetitive description of like elements employed in other embodiments described herein is omitted for sake of brevity.

The first superconducting SAW resonator 102 can comprise a first superconducting metallic/dielectric mirror (e.g., a first Bragg mirror 202) and a second superconducting metallic/dielectric mirror (e.g., a second Bragg mirror 204). The first Bragg mirror 202 can be separated from the second Bragg mirror 204 by a distance that is an odd integer multiple of a half-wavelength supported by the first superconducting SAW resonator 102. The Bragg mirrors comprise respective periodic structures of metallic fingers and dielectric gaps positioned at a defined distance from one another.

According to some implementations, the first superconducting SAW resonator 102 can be attached to (e.g., realized on) a low-loss piezo-electric dielectric substrate (not shown). The low-loss piezo-electric dielectric substrate can comprise a material selected from a group of materials comprising one or more of quartz, gallium arsenide, lithium niobite, and zinc oxide, or a similar material.

Further, a first interdigitated capacitance device or first IDC device 206 and a second IDC device 208 can be included in the first superconducting SAW resonator 102. The first IDC device 206 can couple between the first superconducting SAW resonator 102 and the JRM 106. The second IDC device 208 can couple between the first superconducting SAW resonator 102 and an external port (e.g., a signal port 210).

For example, the first IDC device 206 can be positioned at a center of the first superconducting SAW resonator 102. A first set of opposite nodes of the JRM 106 can be connected to opposite nodes of the first IDC device 206. For example, the first node 124 of the JRM 106 can be connected to a first side of the first IDC device 206 (e.g., via the first superconducting wire 132). Further, the third node 128 of the JRM 106 can be connected to a second side of the first IDC device 206 (e.g., via the second superconducting wire 134).

The second superconducting SAW resonator 104 can comprise a first superconducting metallic/dielectric mirror (e.g., illustrated as a third Bragg mirror 212) and a second superconducting metallic/dielectric mirror (e.g., illustrated as a fourth Bragg mirror 214). The third Bragg mirror 212 can be separated from the fourth Bragg mirror 214 by a distance that is an odd integer multiple of a half-wavelength supported by the second superconducting SAW resonator 104. The Bragg mirrors comprise respective periodic structures of metallic fingers and dielectric gaps positioned at a defined distance from one another.

According to some implementations, the second superconducting SAW resonator 104 can be attached to (e.g., realized on) a low-loss piezo-electric dielectric substrate (not shown). The low-loss piezo-electric dielectric substrate can comprise a material selected from a group of materials comprising one or more of quartz, gallium arsenide, lithium niobite, and zinc oxide, or a similar material.

Further, the second superconducting SAW resonator 104 can comprise a first interdigitated capacitance device (e.g., illustrated as a third IDC device 216) and a second interdigitated capacitance device (e.g., illustrated as a fourth IDC device 218). The third IDC device 216 can couple between the second superconducting SAW resonator 104 and the JRM 106. The fourth IDC device 218 can couple between the second superconducting SAW resonator 104 and an external port (e.g., an idler port 220).

For example, the third IDC device 216 can be positioned at a center of the second superconducting SAW resonator 104. A second set of opposite nodes of the JRM 106 can be connected to opposite nodes of the third IDC device 216. For example, the second node 126 of the JRM 106 can be connected to a first side of the third IDC device 216 (e.g., via the third superconducting wire 136). Further, the fourth node 130 of the JRM 106 can be connected to a second side of the third IDC device 216 (e.g., via the fourth superconducting wire 138).

The circuit 100 can also comprise a first external feedline 222 coupled to the first superconducting SAW resonator 102 through the second IDC device 208. The first external feedline 222 can be connected to the signal port 210 (e.g., a radio frequency (rf) source). The first external feedline 222 can carry one or more input signals and one or more output signals of the first superconducting SAW resonator 102.

A second external feedline 224 can be coupled to the second superconducting SAW resonator 104 through the fourth IDC device 218. The second external feedline 224 can be connected to the idler port 220. The second external feedline 224 can carry one or more input signals and one or more output signals of the second superconducting SAW resonator 104.

Further, the JRM 106 can be operatively connected to a pump port 226 (e.g., via coupling to the first superconducting wire 132 and the second superconducting wire 134 or other wires). The pump port 226 can be connected to a microwave source. The pump port 226 can supply the required energy for the operation of the circuit 100. For example, upon or after pump power is supplied from the pump port 226 to the JRM 106, the first superconducting SAW resonator 102 and the second superconducting SAW resonator 104 can be electrically connected through the JRM 106. However, when power is not supplied through the pump port 226 (e.g., the power supply is off), the first superconducting SAW resonator 102 and the second superconducting SAW resonator 104 can be electrically isolated from one another.

For amplification, ideally there would be a microwave signal that is propagating on the idler transmission line (e.g., the second external feedline 224) that is connected to the idler port 220. In an example, assume that the microwave signal is weak and it carries some quantum information that is of value. The information goes into the circuit 100 and there is a pump tone that is fed to the device (e.g., via the pump port 226) that can generate a parametric amplification between the idler mode and the signal mode supported by the first superconducting SAW resonator 102. In this example, an input signal is not needed at both the signal port 210 and the idler port 220. Instead, a signal is only needed on one port and quantum noise can enter through the other port. The deterministic signal carrying quantum information and the quantum noise can be mixed by the device via the pump drive and amplified upon leaving the device. Thus, the signal that carries information can come either from the signal port 210, or the idler port 220, or can have two signals carrying information entering both ports at substantially the same time. For simplicity, assume the signal is entering the circuit 100 through one port and the other port is only receiving quantum noise. In this case, through the interaction with the pump (e.g., the pump port 226) and the JRM 106 three-wave mixing takes place between the common mode (pump) and two differential modes (the idler and the signal). If the pump frequency is the sum of the signal and idler resonance frequencies, the device functions as a phase-preserving parametric amplifier operating near the quantum limit. The respective output signal exiting the signal port 210 and the idler port 220 can be an amplified superposition of the input signals entering both ports (e.g., the signal port 210 and the idler port 220).

According to some implementations, magnetic flux threading the JRM 106 can be induced through the one or more external superconducting magnetic coils. For example, magnetic flux threading the JRM 106 can be induced using external superconducting magnetic coils attached to a device package or using on-chip flux lines.

Figure 3:
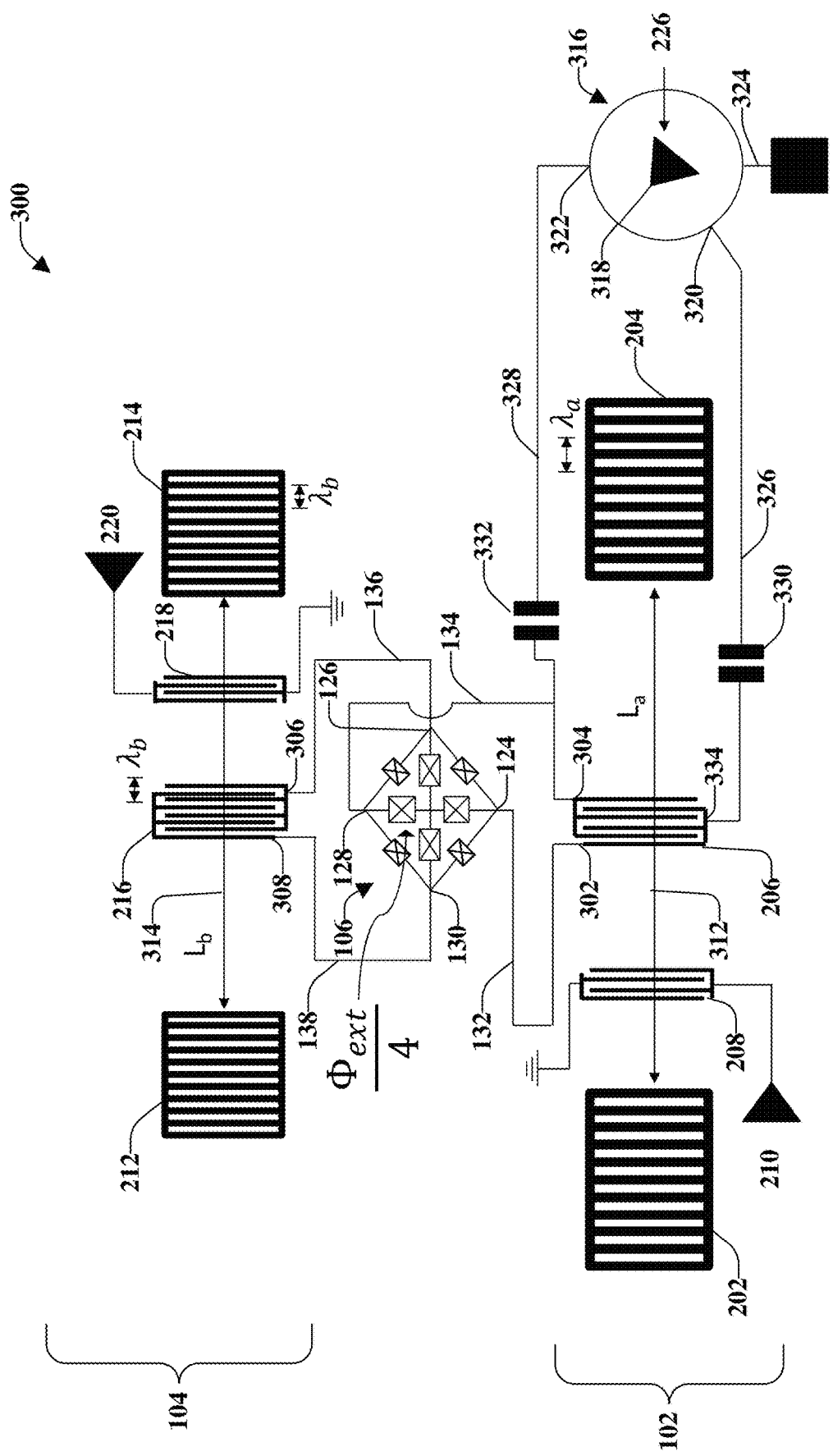
FIG. 3 illustrates an example, non-limiting, schematic of a circuit for a superconducting device that comprises surface acoustic wave resonators coupled to a Josephson ring modulator in accordance with one or more embodiments described herein.

In further detail, FIG. 3 illustrates an example, non-limiting, schematic of a circuit 300 for a superconducting device that comprises surface acoustic wave resonators coupled to a Josephson ring modulator in accordance with one or more embodiments described herein. Repetitive description of like elements employed in other embodiments described herein is omitted for sake of brevity.

It is noted that the Josephson junctions and the four internal junctions of the JRM 106 are not labeled in FIG. 3 for purposes of simplicity. However, the element numbering of the junctions for purposes of explanation are the same as the labeling of FIGS. 1 and 2. In addition, the circuit 300 and its associated components can be implemented on a single chip, according to some implementations.

As mentioned, the nodes of the JRM 106 can comprise a first set of opposite nodes that can be oriented in a vertical direction to one another. For example, the first set of opposite nodes can comprise the first node 124 and the third node 128, which can operatively couple the JRM 106 to the first superconducting SAW resonator 102 (e.g., via the first superconducting wire 132 and the second superconducting wire 134). Further, the nodes of the JRM 106 can comprise a second set of opposite nodes, which can be oriented in a horizontal manner. For example, the second set of opposite nodes can comprise the second node 126 and the fourth node 130, which can operatively couple the JRM 106 to the second superconducting SAW resonator 104 (e.g., via the third superconducting wire 136 and the fourth superconducting wire 138). It is noted that although illustrated and described with respect to a horizontal direction and/or a vertical direction, the disclosed aspects are not limited to this orientation and other orientations can be utilized.

The first set of opposite nodes (e.g., the first node 124 and the third node 128) can be coupled to opposite electrodes of the first IDC device 206 of the first superconducting SAW resonator 102, creating a first orthogonal mode. For example, the first node 124 of the JRM 106 can be coupled to a first electrode of the first IDC device 206, indicated at 302 (e.g., via the first superconducting wire 132). Further, the third node 128 of the JRM 106 can be coupled to a second electrode of the first IDC device 206, indicated at 304 (e.g., via the second superconducting wire 134). The first IDC device 206 can be positioned at a center of the first superconducting SAW resonator 102.

The second set of opposite nodes (e.g., the second node 126 and the fourth node 130) can be can be coupled to opposite electrodes of the third IDC device 216 of the second superconducting SAW resonator 104, creating a second orthogonal mode. For example, the second node 126 of the JRM 106 can be coupled to a first electrode of the third IDC device 216, indicated at 306 (e.g., via the third superconducting wire 136). Further, the fourth node 130 of the JRM 106 can be coupled to a second electrode of the third IDC device 216, indicated at 308 (e.g., via the fourth superconducting wire 138). The third IDC device 216 can be positioned at a center of the second superconducting SAW resonator 104.

As illustrated, the first superconducting SAW resonator 102 can comprise the first IDC device 206, the second IDC device 208, and a set of metallic/dielectric mirrors (e.g., the first Bragg mirror 202 and the second Bragg mirror 204). The components of the first superconducting SAW resonator 102 (e.g., the first IDC device 206, the second IDC device 208, the first Bragg mirror 202, the second Bragg mirror 204) can be implemented on a piezo-electric substrate. For example, the piezo electric substrate can comprise one or more of quartz, gallium arsenide, lithium niobite, zinc oxide, and/or similar materials.

In a similar manner, the second superconducting SAW resonator 104 can comprise the third IDC device 216, the fourth IDC device 218, and a set of metallic/dielectric mirrors (e.g., the third Bragg mirror 212 and the fourth Bragg mirror 214). The components of the second superconducting SAW resonator 104 (e.g., the third IDC device 216, the fourth IDC device 218, the third Bragg mirror 212, the fourth Bragg mirror 214) can be implemented on a piezo-electric substrate. For example, the piezo electric substrate can comprise one or more of quartz, gallium arsenide, lithium niobite, zinc oxide, and/or similar materials.

Different ports can be utilized to access the first superconducting SAW resonator 102 and the second superconducting SAW resonator 104. For example, the signal port 210 can be utilized to access the first superconducting SAW resonator 102 and the idler port 220 can be utilized to access the second superconducting SAW resonator 104.

The signal port 210 can be utilized to carry input signals and output signals. Therefore, in order to measure output signals from the first superconducting SAW resonator 102, an IDC (e.g., the second IDC device 208) can be placed between the first Bragg mirror 202 and the second Bragg mirror 204. One set of IDC fingers that are connected together are located at an rf-voltage anti-node (maximum/minimum) of the supported phononic mode. Therefore, the spacing between the fingers can be determined by the wavelength supported by the first superconducting SAW resonator 102.

A distance between the centers of two consecutive fingers of the IDCs (e.g., the first IDC device 206 and the second IDC device 208) can be generally expressed as $\lambda_a/2$. The respective two sets of fingers of the IDCs can have opposite polarity according to an implementation. Further, the first Bragg mirror 202 and the second Bragg mirror 204 can be separated from one other, as indicated by line 312, by a distance that is an odd integer multiple of half-wavelength supported by the first superconducting SAW resonator 102. The defined distance can be expressed as $L_a$, wherein $L_a$ is an odd-integer multiple of $\lambda_a/2$.

The idler port 220 can be utilized to carry input signals and output signals. Therefore, in order to measure output signals from the second superconducting SAW resonator 104, an IDC (e.g., the fourth IDC device 218) can be placed between the third Bragg mirror 212 and the fourth Bragg mirror 214. One set of IDC fingers that are connected together are located at an rf-voltage anti-node (maximum/minimum) of the supported phononic mode. Therefore, the spacing between the fingers can be determined by the wavelength supported by the second superconducting SAW resonator 104.

A distance between the centers of two consecutive fingers of the IDCs (e.g., the third IDC device 216 and the fourth IDC device 218) can be generally expressed as $\lambda_b/2$. The respective two sets of fingers of the IDCs can have opposite polarity according to an implementation. Further, the third Bragg mirror 212 and the fourth Bragg mirror 214 can be separated from one other, as indicated by line 314, by a distance that is an odd integer multiple of half-wavelength supported by the second superconducting SAW resonator 104. The defined distance can be expressed as $L_b$, wherein $L_b$ is an odd-integer multiple of $\lambda_b/2$. Where $\lambda_b < \lambda_a$.

A microwave tone is characterized by a wave that has a maximum amplitude and a minimum amplitude. The minimum amplitude should couple to one finger of the first IDC device 206 (e.g., indicated at 302 or 304) and the maximum amplitude should couple to the other finger, (e.g., indicated at 304 or 302) where the two fingers are connected to opposite nodes of the JRM 106 (e.g., the first node 124 and the third node 128). Therefore, the distance $\lambda_a/2$ can be selected to facilitate the maximum on the first finger and the minimum on the other finger.

In a similar manner, the minimum amplitude should couple to one finger of the third IDC device 216 (e.g., indicated at 306 or 308) and the maximum amplitude should couple to the other finger (e.g., indicated at 308 or 306) where the two fingers are connected to opposite nodes of the JRM 106 (e.g., the second node 126 and the fourth node 130). Therefore, the distance $\lambda_b/2$ can be selected to facilitate the maximum on the first finger and the minimum on the other finger.

Further, for purposes of explanation, the maximum amplitude has a plus sign (or a positive value) and the minimum amplitude has a minus sign (or a negative value). Therefore, the two opposite nodes of the JRM 106 can be excited by the positive (on the first finger) and the negative rf-voltages (on the second finger). These signals can alternate with time. However, they should be opposite to one another at any given time. When the polarity is different, it can be referred to as a differential mode (where differential means opposite sign). Accordingly, a first differential mode of the JRM 106 is supported by the first superconducting SAW resonator 102 and a second differential mode of the JRM 106 is supported by the second superconducting SAW resonator 104.

Further, in order to perform the mixing, or the amplification, microwave energy is supplied for device operation. The energy source for the mixing and/or amplification is supplied through the pump port 226. The pump port 226 can provide a microwave signal, which can be a strong, coherent, non-resonant microwave tone that can supply energy for the circuit 100 to operate. According to some implementations, the microwave signal supplied by the pump port 226 can comprise a frequency that satisfies a defined equation determined based on the energy conservation of the three-wave mixing occurring in the circuit 100.

In an example of amplification performed by the device, a first signal $f_a$ which lies within the bandwidth of the first superconducting SAW resonator 102 and a second signal $f_b$ which lies within the bandwidth of the second superconducting SAW resonator 104. Further, the frequency of the second signal can be larger than the frequency of the first signal ($f_b > f_a$). To amplify both signals, the frequency of the pump tone fed through the pump port 226 should be the sum of the first signal and the second signal (e.g., $f_a + f_b$). The energy of the electromagnetic signal is proportional to its frequency. By taking the pump (e.g., the pump port 226) frequency to be the sum, if the pump interacts with the dispersive nonlinear medium (e.g., the JRM 106), a down-conversion process can occur where the energetic photons of the pump split into a first set of phonons at $f_a$ and a second set of phonons at $f_b$. If the frequency is the sum, then the photons can split in this manner. For example, the photons can split into two halves: a first half (e.g., the first set of phonons) at the lower frequency $f_a$ and a second half (e.g., the second set of phonons) at the higher frequency $f_b$. Therefore, amplification can occur because the pump exchanges energy with the signal mode and idler mode and through this exchange entangled phonons are generated in both modes. In this case, the pump frequency should be equal to the difference between $f_a$ and $f_b$. Here $f_b$ is larger, so the equation can be $f_b$ minus $f_a$.

As illustrated the gaps of the first IDC device 206 and the second IDC device 208 are larger (e.g., there is more distance between the fingers) than the gaps (or distance) of the third IDC device 216 and the fourth IDC device 218. The frequency $f_a$ of the first superconducting SAW resonator 102 is lower than the frequency $f_b$ of the second superconducting SAW resonator 104. There is a one to one mapping between the frequency and the wavelength. The frequencies are linked through the speed of light or the speed of sound through the surface. If the wavelength ($\lambda$) times the frequency f is a constant, it is equal to either the speed of light or the speed of sound in the medium. Since the product is fixed, if one is increased, the other one will decrease and vice versa. Thus, if the frequency is lowered, the corresponding wavelength will increase, and vice versa.

According to an implementation, in the mixing process a phonon in the first SAW resonator at the signal frequency can be upconverted into a phonon in the second SAW resonator at the idler frequency. According to another implementation, the phonon in the second SAW resonator at the idler frequency can be downconverted to a phonon in the first SAW resonator at the signal frequency. The energy exchange is enabled by the pump drive (e.g., fed through the pump port 226). Accordingly, either a pump photon is absorbed or a pump phonon is emitted to facilitate the process.

If there is no pump signal applied to the pump port 226, the first superconducting SAW resonator 102 and the second superconducting SAW resonator 104 are separated (e.g., isolated from one another) and information exchange or information communications between the first superconducting SAW resonator 102 and the second superconducting SAW resonator 104 does not occur. Upon or after a pump signal is applied to the pump port 226, it excites the common mode of the JRM 106, as illustrated in FIG. 3, the first superconducting SAW resonator 102 and the second superconducting SAW resonator 104 interact and information is exchanged.

According to some implementations, the pump drive is fed through the sigma port 318 of a 180-degree hybrid 316, which is capacitively coupled to opposite nodes of the JRM 106, which in turn excites a common-mode of the JRM 106. According to some implementations, the 180-degree hybrid 316 operates as a power splitter.

By way of explanation and not limitation, a 180-degree hybrid is a passive microwave component that comprises four ports. A first port is referred to as a sum port (e.g., the sigma port 318). If a signal is input to the sigma port 318, the signal splits equally between two other ports (e.g., a second port 320 and a third port 322). The signals that are output from the second port 320 and the third port 322 can have the same phase. Thus, the first port is referred to as the sigma port 318 because the phases of the split signals are equal. The pump drive (e.g., the pump port 226) can be fed through the sigma port 318 of the 180-degree hybrid 316.

A fourth port can be referred to as a delta port 324 (or a difference port). If a signal is injected through the delta port 324 of the 180-degree hybrid (which, in FIG. 3, is terminated with 50 ohms), the hybrid would split the signal into two signals, coming out of the two ports (e.g., the second port 320 and the third port 322), but the split signals have a 180-degree phase difference. For example, if a first signal has a maximum value at one port (e.g., the second port 320), the second signal at the other port (e.g., the third port 322) has a minimum value.

Also illustrated are a first lead 326 coming out of the second port 320 and a second lead 328 coming out of the third port 322. The signals that are output at the second port 320 and the third port 322 are half of the pump signal and have the same phase, as discussed above. The signals encounter small coupling capacitors (e.g., a first coupling capacitor 330 and a second coupling capacitor 332) that can be coupled to two opposite nodes of the JRM 106. According to some implementations, the first coupling capacitor 330 and the second coupling capacitor 332 can be respective capacitors chosen from a group of capacitors comprising a gap capacitor, an interdigitated capacitor, and a plate capacitor. As it relates to plate capacitance, the dielectric material should have very low-loss at the level of single microwave photons.

The first coupling capacitor 330 can be coupled to the first node 124 of the JRM 106 (through the first IDC device 206) and the second coupling capacitor 332 can be coupled to the third node 128 of the JRM 106. In further detail, the first lead 326 and the second lead 328 can couple to two different sets of fingers of the first IDC device 206 (illustrated at the first contact point at the second electrode 304 and a third contact point 334), that couple to two opposite nodes of the JRM 106. This connection enables exciting the common mode of the JRM 106 where the two opposite nodes of the JRM 106 are excited, not with opposite rf-voltage signs, but with equal signs. For example, the two opposite nodes can be excited with a positive-positive signal or a negative-negative signal.

The first lead 326 and the second lead 328 can be connecting superconducting wires that should be equal in length (e.g., phase matched) between the ports (e.g., the second port 320 and the third port 322) of the 180 degree hybrid and the coupling capacitors (e.g., the first coupling capacitor 330 and the second coupling capacitor 332, respectively). Similarly, the first superconducting wire 132 and the second superconducting wire 134 pair, and the third superconducting wire 136 and the fourth superconducting wire 138 pair, can be connecting superconducting wires that should be equal in length (e.g., phase matched) between the opposite nodes of the JRM 106 and the electrodes of the IDCs (e.g., the first IDC device 206, the third IDC device 216). Further, the connecting superconducting wires should be as short as possible and wide (e.g., have small series inductance).

The following provides further technical comments for an understanding of the various aspects disclosed herein. The speed of sound in the various piezoelectric substrates can be slower than the speed of light by several orders of magnitude (e.g., approximately five orders of magnitude, for example, $10^5$).

The effective length of the first superconducting SAW resonator 102 can be slightly larger than $L_a$. Further, the effective length of the second superconducting SAW resonator 104 can be slightly larger than $L_b$. The lengths are slightly larger than $L_a$ and $L_b$ because the reflection off the Bragg mirrors does not happen on the mirror edges but within a certain penetration depth inside the Bragg mirrors.

The effective length ($L_{eff}$) of the first superconducting SAW resonator 102 and/or the second superconducting SAW resonator 104 and the speed of sound in the piezoelectric substrate ($v_s$) can determine the cavity free spectral range (FSR):

$$v_{FSR} = \frac{v_s}{2L_{eff}}.$$

The SAW resonators can be similar to photonic cavities that support multimodes (resonances). The cavity free spectral range parameter can determine the frequency spacing between the multimodes supported by the first superconducting SAW resonator 102 and/or the second superconducting SAW resonator 104.

The larger the spacing between the Bragg mirrors, the larger $L_{eff}$ is, and as a result the smaller the frequency separation between the SAW resonator modes. The Bragg mirrors can operate as reflective mirrors within a certain bandwidth. Modes that fall beyond their bandwidth are not supported by the SAW resonator because their phononic modes are not confined.

Depending on the $V_{FSR}$ and the bandwidth of the Bragg mirrors, the circuit 100 can operate over a single, a few, or many modes of the SAW resonator. It is noted that not all the modes supported by the SAW resonator would strongly couple to the JRM. Three-wave mixing operations in the circuit 100 can take place with phononic modes that couple strongly to the JRM. Modes couple strongly to the JRM when their anti-nodes align with the IDC fingers coupled to the JRM.

Figure 4:
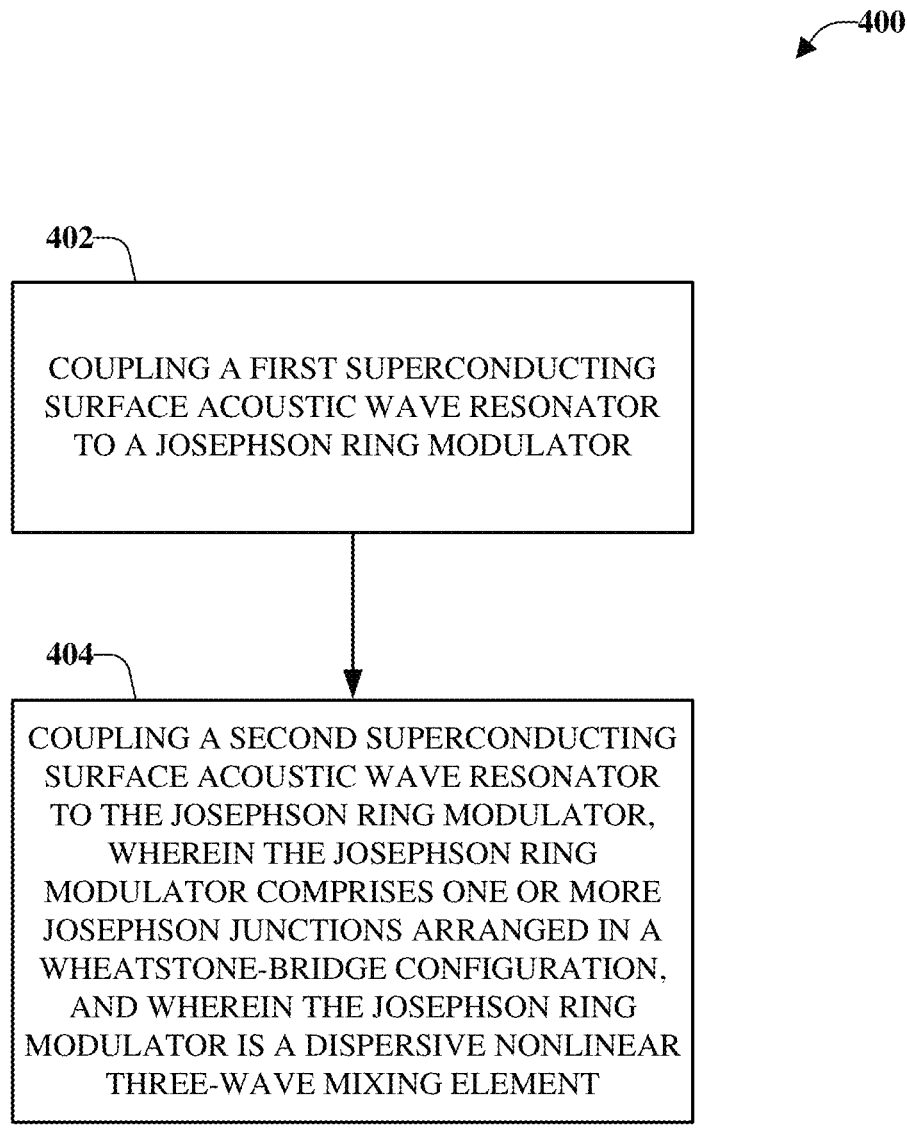
FIG. 4 illustrates a flow diagram of an example, non-limiting, method for fabrication of a device in accordance with one or more embodiments described herein.

FIG. 4 illustrates a flow diagram of an example, non-limiting, method 400 for fabrication of a device in accordance with one or more embodiments described herein. Repetitive description of like elements employed in other embodiments described herein is omitted for sake of brevity.

At 402 of the method 400, a first surface acoustic wave resonator (e.g., the first superconducting SAW resonator 102) can be coupled to a Josephson ring modulator (e.g., the JRM 106). For example, the first surface acoustic wave resonator can be coupled to a first set of opposite nodes (e.g., the first node 124 and the third node 128) of the Josephson ring modulator.

The method 400 can also include, at 404, coupling a second superconducting surface acoustic wave resonator (e.g., the second superconducting SAW resonator 104) to the Josephson ring modulator. The second superconducting surface acoustic wave resonator can be coupled to a first set of opposite nodes (e.g., the second node 126 and the fourth node 130) of the Josephson ring modulator.

The Josephson ring modulator can comprise one or more Josephson junctions (e.g., the first Josephson junction 108, the second Josephson junction 110, the third Josephson junction 112, the fourth Josephson junction 114) arranged in a Wheatstone-bridge configuration. The one or more Josephson junctions can comprise a first material selected from a first group of materials comprising aluminum and niobium. Further, the Josephson ring modulator can be a dispersive nonlinear three-wave mixing element.

Figure 5:
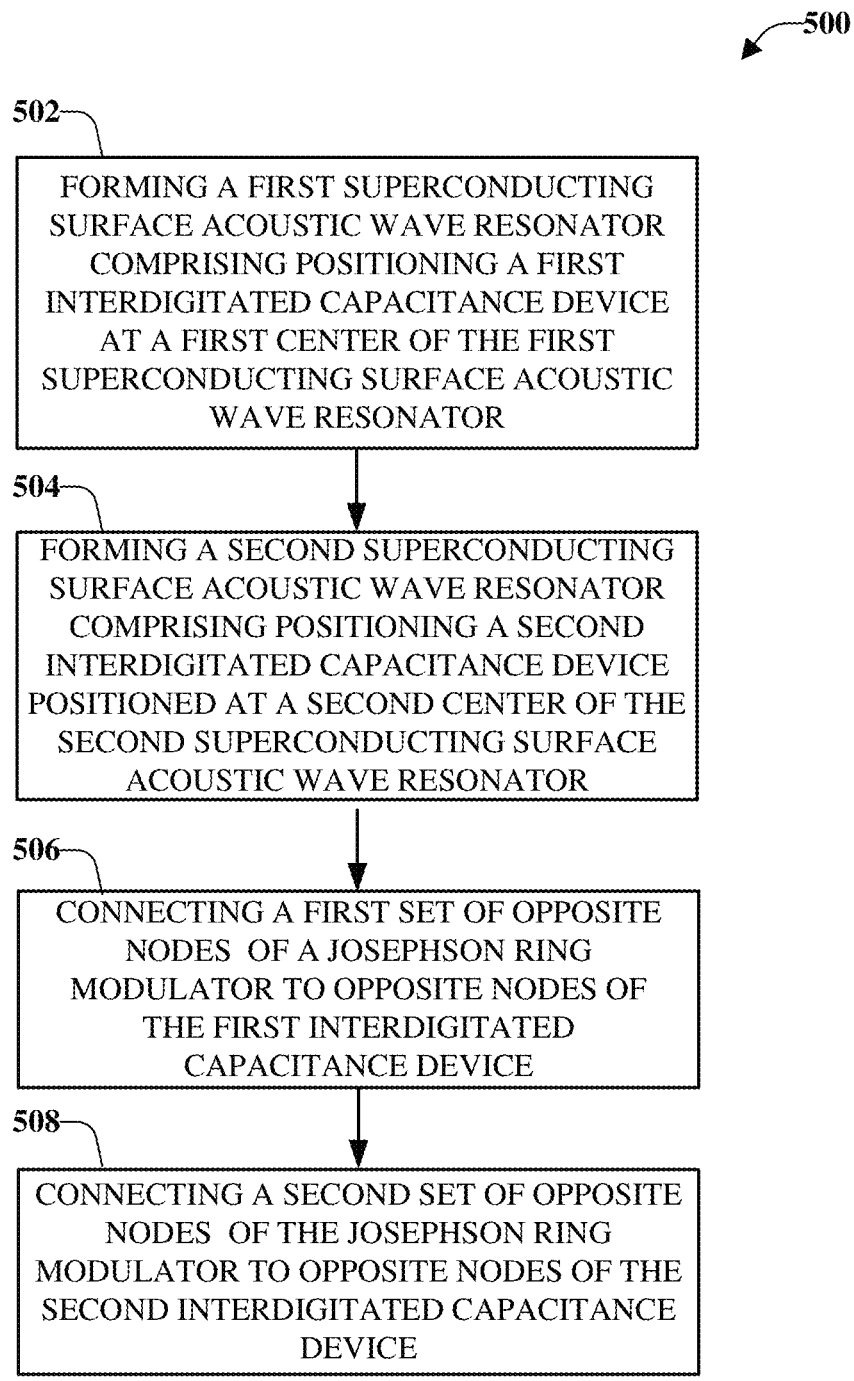
FIG. 5 illustrates a flow diagram of an example, non-limiting, method for fabrication of a device comprising two superconducting surface acoustic wave resonators in accordance with one or more embodiments described herein.

FIG. 5 illustrates a flow diagram of an example, non-limiting, method 500 for fabrication of a device comprising two superconducting surface acoustic wave resonators in accordance with one or more embodiments described herein. Repetitive description of like elements employed in other embodiments described herein is omitted for sake of brevity.

At 502 the method 500 can comprise forming a first superconducting surface acoustic wave resonator (e.g., the first superconducting SAW resonator 102) comprising positioning a first interdigitated capacitance device (e.g., the first IDC device 206) at a first center of the first superconducting surface acoustic wave resonator.

Further, at 504 the method can comprise forming a second superconducting surface acoustic wave resonator (e.g., the second superconducting SAW resonator 104) comprising positioning a second interdigitated capacitance device (e.g., the third IDC device 216) at a second center of the second superconducting surface acoustic wave resonator.

At 506 the method 500 can comprise connecting a first set of opposite nodes (e.g., the first node 124 and the third node 128) of a Josephson ring modulator (e.g., the JRM 106) to opposite nodes (e.g., the first electrode 302 and the second electrode 304) of the first interdigitated capacitance device.

In addition, at 508 the method 500 can comprise connecting a second set of opposite nodes (e.g., the second node 126 and the fourth node 130) of the Josephson ring modulator to opposite nodes (e.g., the third electrode 306 and the fourth electrode 308) of the second interdigitated capacitance device.

Figure 6:
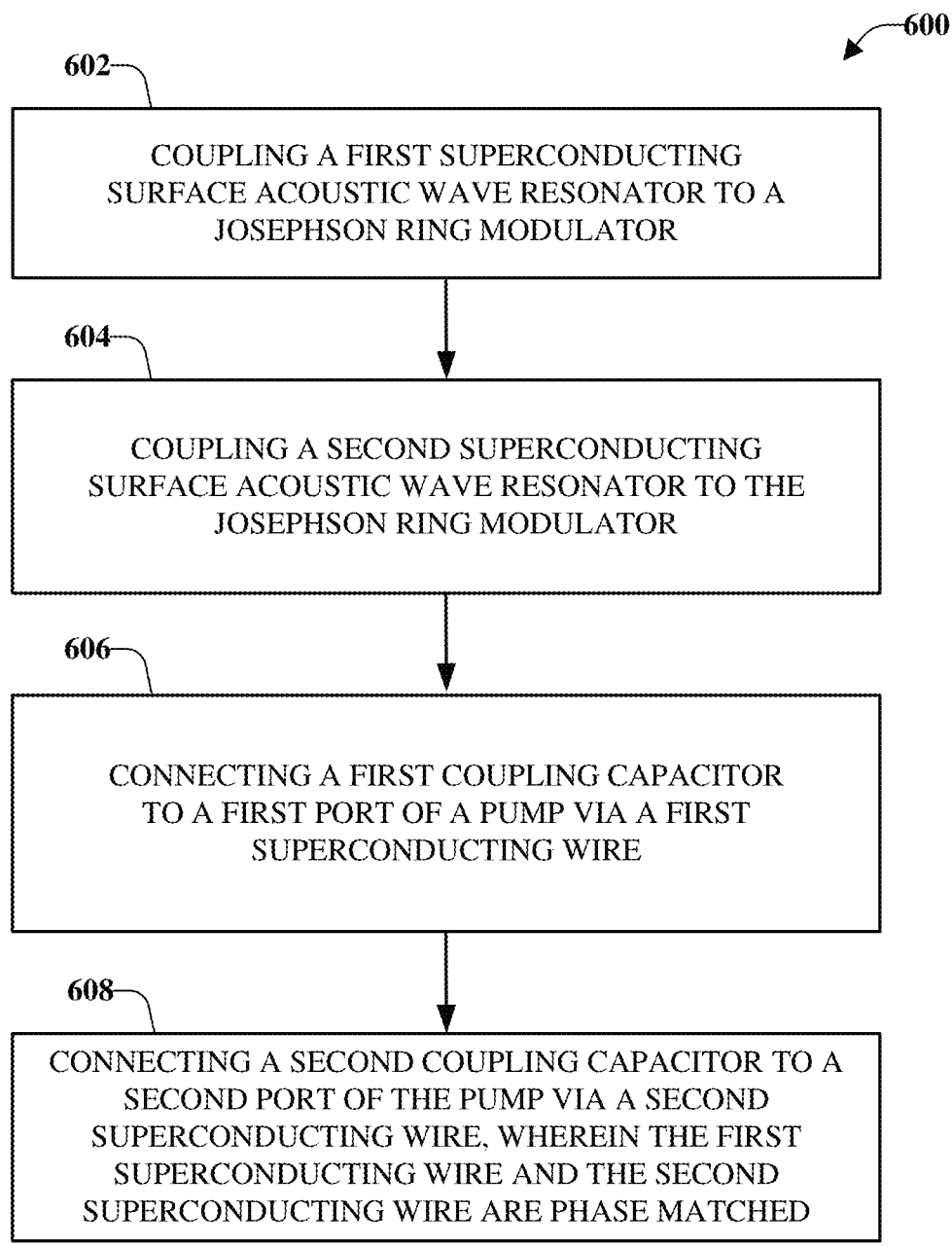
FIG. 6 illustrates a flow diagram of an example, non-limiting, method for fabrication of a device comprising a pump drive port in accordance with one or more embodiments described herein.

FIG. 6 illustrates a flow diagram of an example, non-limiting, method 600 for fabrication of a device comprising a pump drive port in accordance with one or more embodiments described herein. Repetitive description of like elements employed in other embodiments described herein is omitted for sake of brevity.

The method 600 starts at 602, when a first surface acoustic wave resonator (e.g., the first superconducting SAW resonator 102) can be coupled to a Josephson ring modulator (e.g., the JRM 106). Further, at 604, a second superconducting surface acoustic wave resonator (e.g., the second superconducting SAW resonator 104) can be coupled to the Josephson ring modulator.

Further, at 606, a first coupling capacitor (e.g., the first coupling capacitor 330) can be coupled to a first port (e.g., the second port 320) of a pump (e.g., the pump port 226) via a first superconducting wire (e.g., the first lead 326). In addition, at 608 the method can comprise connecting a second coupling capacitor (e.g., the second coupling capacitor 332) to a second port (e.g., the third port 322) of the pump via a second superconducting wire. According to some implementations, the first superconducting wire and the second superconducting wire can be phase matched.

Figure 7:
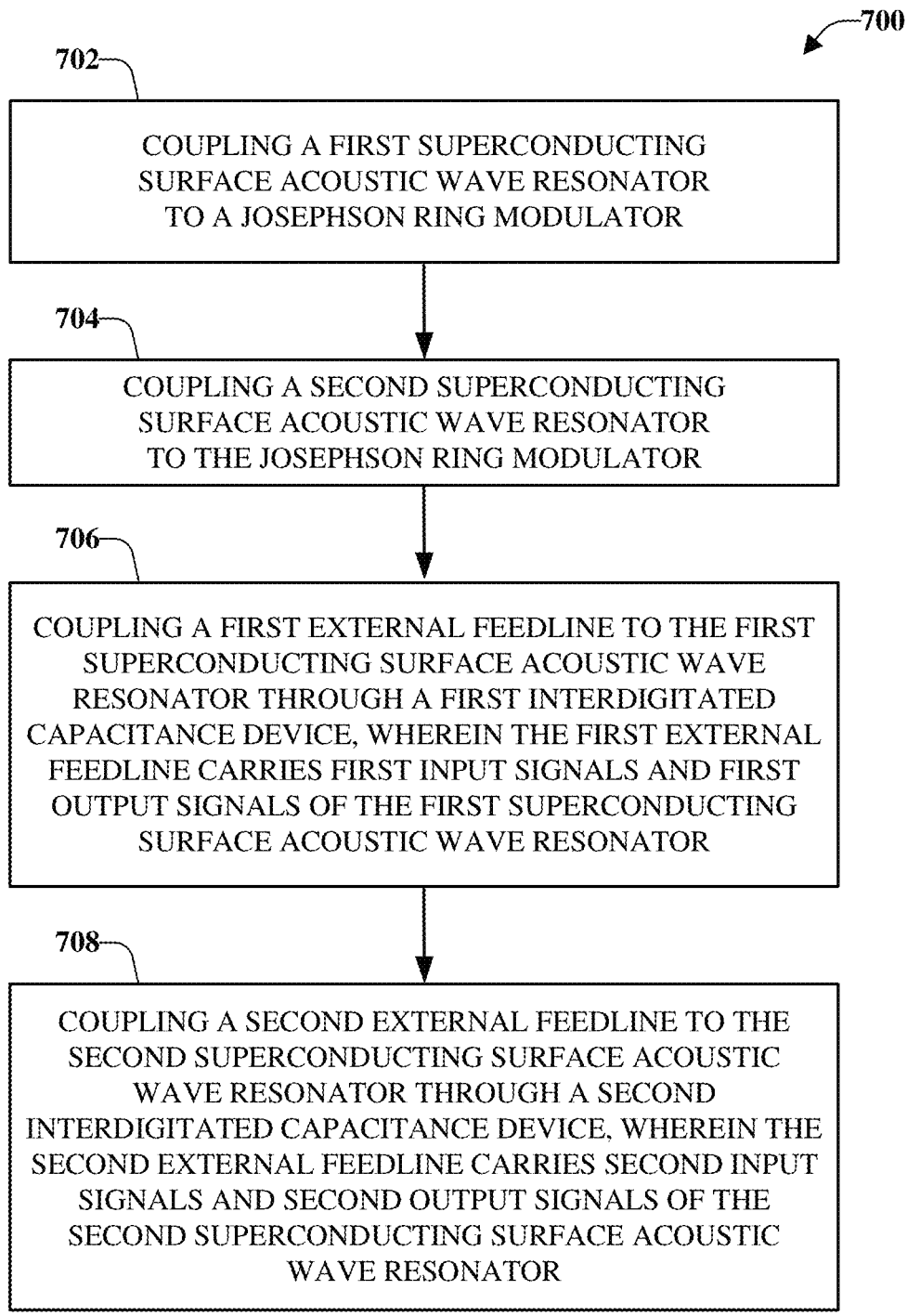
FIG. 7 illustrates a flow diagram of an example, non-limiting, method for fabrication of a device comprising external feedlines in accordance with one or more embodiments described herein.

FIG. 7 illustrates a flow diagram of an example, non-limiting, method 700 for fabrication of a device comprising external feedlines in accordance with one or more embodiments described herein. Repetitive description of like elements employed in other embodiments described herein is omitted for sake of brevity.

The method 700 starts, at 702, and a first superconducting surface acoustic wave resonator (e.g., the first superconducting SAW resonator 102) can be coupled to a Josephson ring modulator (e.g., the JRM 106). The first superconducting surface acoustic wave resonator can be realized on a low-loss piezo-electric dielectric substrate. For example, the low-loss piezo-electric dielectric substrate can comprise one or more materials selected from a group of materials comprising one or more of quartz, gallium arsenide, lithium niobite, and zinc oxide.

Further, at 704, a second superconducting surface acoustic wave resonator (e.g., the second superconducting SAW resonator 104) can be coupled to the Josephson ring modulator. The second superconducting surface acoustic wave resonator can be realized on a low-loss piezo-electric dielectric substrate. For example, the low-loss piezo-electric dielectric substrate can comprise one or more materials selected from a group of materials comprising one or more of quartz, gallium arsenide, lithium niobite, and zinc oxide.

At 706 of the method 700, a first external feedline (e.g., the first external feedline 222) can be coupled to the first superconducting surface acoustic wave resonator through a first interdigitated capacitance device (e.g., the second IDC device 208). The first external feedline can carry first input signals and first output signals of the first superconducting surface acoustic wave resonator.

At 708, a second external feedline (e.g., the second external feedline 224) can be coupled to the second superconducting surface acoustic wave resonator through a second interdigitated capacitance device (e.g., the fourth IDC device 218). The second external feedline can carry second input signals and second output signals of the second superconducting surface acoustic wave resonator.

Figure 8:
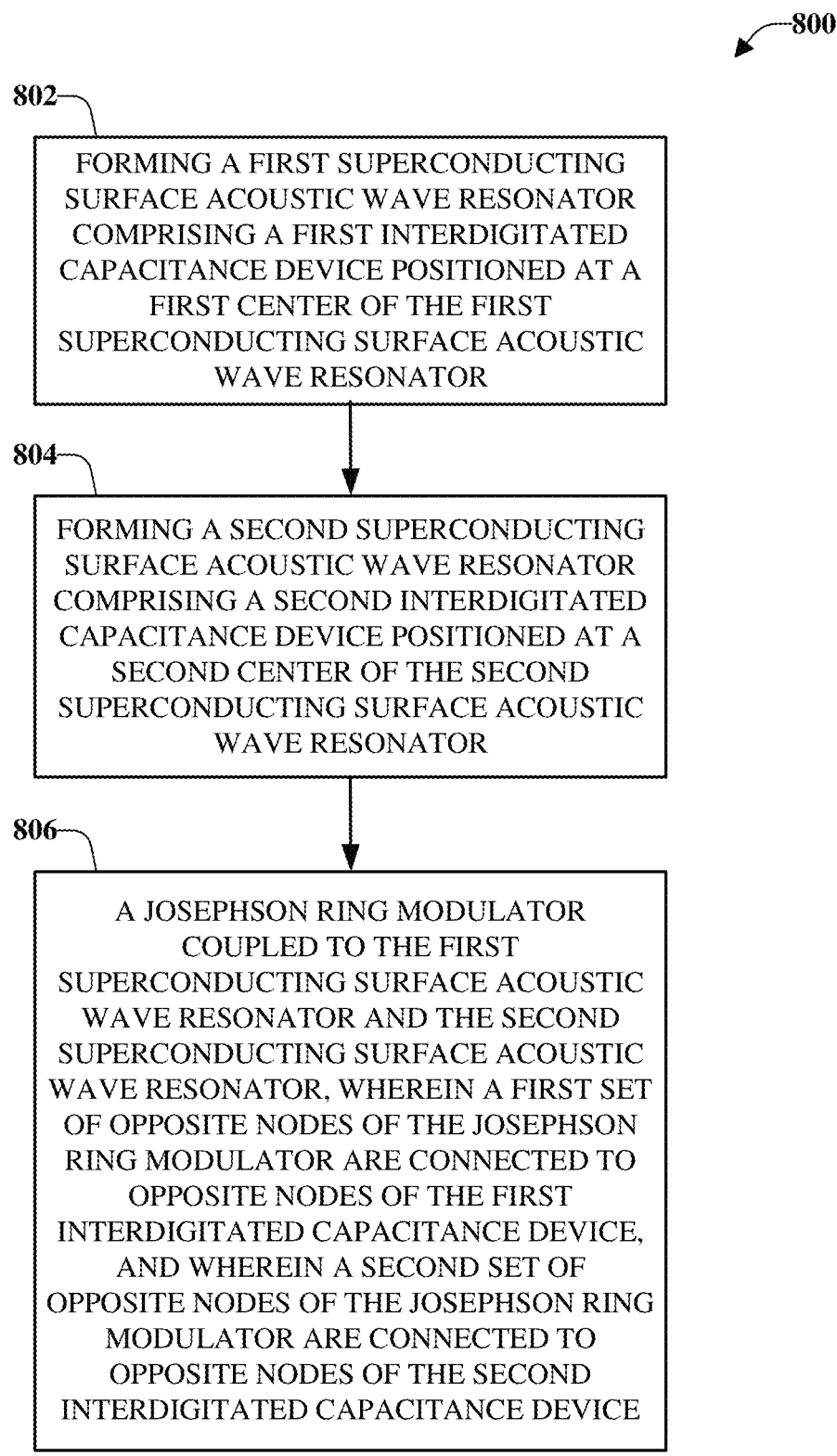
FIG. 8 illustrates a flow diagram of an example, non-limiting, method for fabrication of a superconducting quantum device in accordance with one or more embodiments described herein.

FIG. 8 illustrates a flow diagram of an example, non-limiting, method 800 for fabrication of a superconducting quantum device in accordance with one or more embodiments described herein. Repetitive description of like elements employed in other embodiments described herein is omitted for sake of brevity.

A first superconducting surface acoustic wave resonator (e.g., the first superconducting SAW resonator 102) can be formed at 802 of the method 800. The first superconducting surface acoustic wave resonator can comprise a first interdigitated capacitance device (e.g., the first IDC device 206) positioned at a first center of the first superconducting surface acoustic wave resonator.

At 804, a second superconducting surface acoustic wave resonator (e.g., the second superconducting SAW resonator 104) can be formed. The second superconducting surface acoustic wave resonator can comprise a second interdigitated capacitance device (e.g., the third IDC device 216) positioned at a second center of the second superconducting surface acoustic wave resonator.

Further, at 806, a Josephson ring modulator (e.g., the JRM 106) can be coupled to the first superconducting surface acoustic wave resonator and the second superconducting surface acoustic wave resonator. A first set of opposite nodes (e.g., the first node 124 and the third node 128) of the Josephson ring modulator can be connected to opposite nodes of the first interdigitated capacitance device. A second set of opposite nodes (e.g., the second node 126 and the fourth node 130) of the Josephson ring modulator can be connected to opposite nodes of the second interdigitated capacitance device.

Figure 9:
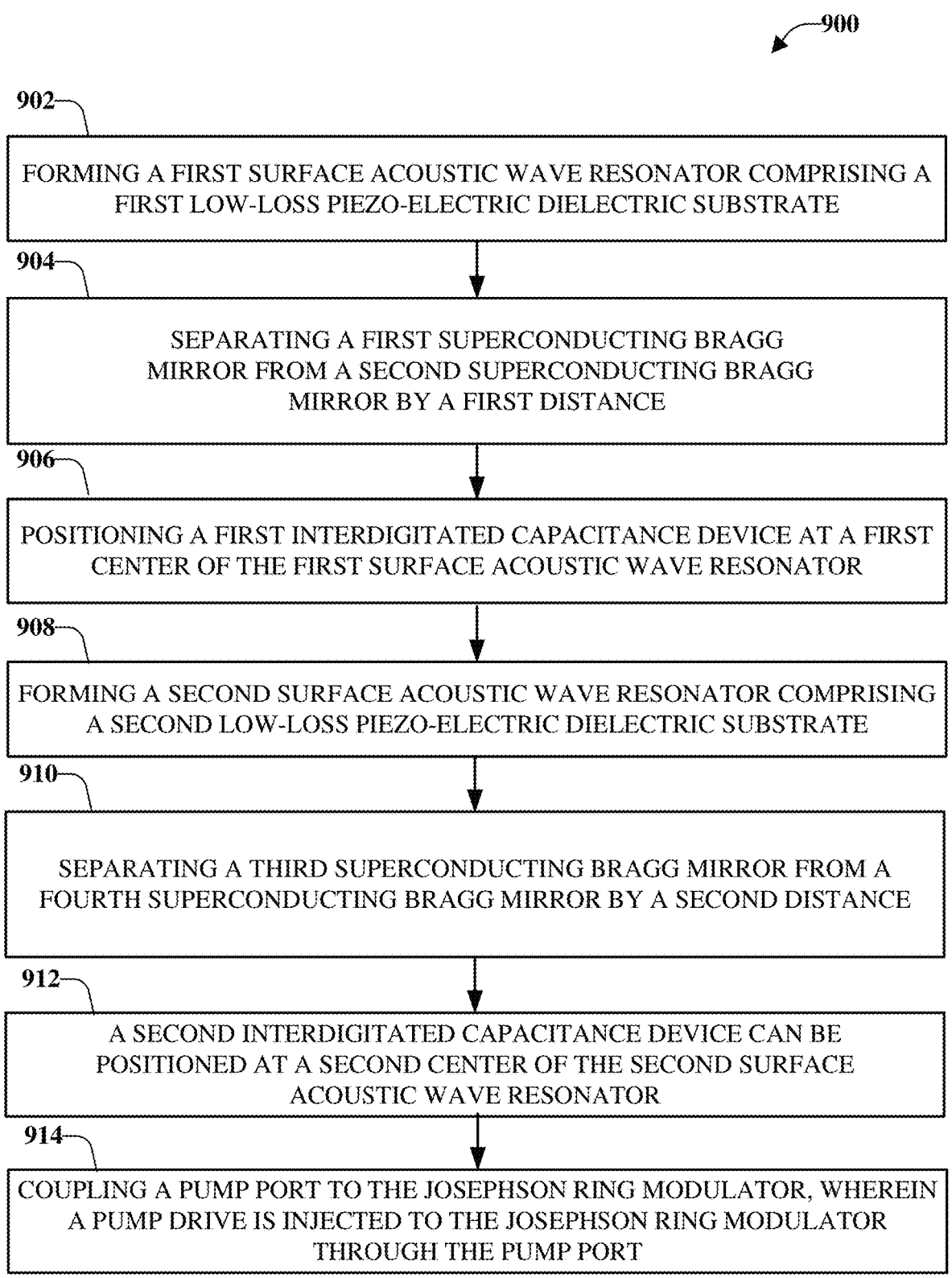
FIG. 9 illustrates a flow diagram of an example, non-limiting, method for fabrication of a superconducting quantum device comprising external feedlines in accordance with one or more embodiments described herein.

FIG. 9 illustrates a flow diagram of an example, non-limiting, method 900 for fabrication of a superconducting quantum device comprising external feedlines in accordance with one or more embodiments described herein. Repetitive description of like elements employed in other embodiments described herein is omitted for sake of brevity.

At 902 of the method 900, a first surface acoustic wave resonator (e.g., the first superconducting SAW resonator 102) comprising a first low-loss piezo-electric dielectric substrate can be formed. Forming the first surface acoustic wave resonator can comprise, at 904, separating a first superconducting Bragg mirror (e.g., the first Bragg mirror 202) from a second superconducting Bragg mirror (e.g., the second Bragg mirror 204) by a first distance.

At 906, a first interdigitated capacitance device (e.g., the first IDC device 206) can be positioned at a first center of the first surface acoustic wave resonator. A first set of opposite nodes (e.g., the first node 124 and the third node 128) of the Josephson ring modulator can be connected to opposite nodes (e.g., the first electrode 302 and the second electrode 304) of the first interdigitated capacitance device.

A second surface acoustic wave resonator (e.g., the second superconducting SAW resonator 104) comprising a second low-loss piezo-electric dielectric substrate can be formed at 908. The first surface acoustic wave resonator can be spatially and spectrally separated from the second surface acoustic wave resonator. Forming the second surface acoustic wave resonator can comprise, at 910, separating a third superconducting Bragg mirror (e.g., the third Bragg mirror 212) from a fourth superconducting Bragg mirror (e.g., the fourth Bragg mirror 214) by a second distance.

At 912, a second interdigitated capacitance device (e.g., the third IDC device 216) can be positioned at a second center of the second surface acoustic wave resonator. A second set of opposite nodes (e.g., the second node 126 and the fourth node 130) of the Josephson ring modulator can be connected to opposite nodes (e.g., the third electrode 306 and the fourth electrode 308) of the second interdigitated capacitance device.

The first low-loss piezo-electric dielectric substrate and the second low-loss piezo-electric dielectric substrate can comprise a material selected from a group of materials comprising of quartz, gallium arsenide, lithium niobite, and zinc oxide.

At 914, a pump port (e.g., the pump port 226) can be coupled to the Josephson ring modulator. A pump drive is injected to the Josephson ring modulator through the pump port. In an example, a first coupling capacitor can be connected via a first superconducting wire to a first port of the pump port (e.g., a first external port). Further, a second coupling capacitor can be connected via a second superconducting wire to a second port of the pump (e.g., a second external port). The first superconducting wire and the second superconducting wire can be phase matched. For example, the first coupling capacitor can be connected to a first port of a pump via a first superconducting wire comprising a first wire length and the second coupling capacitor can be connected to a second port of the pump via a second superconducting wire comprising a second wire length. The first wire length and the second wire length can be a same wire length.

For simplicity of explanation, the methodologies and/or computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 10:
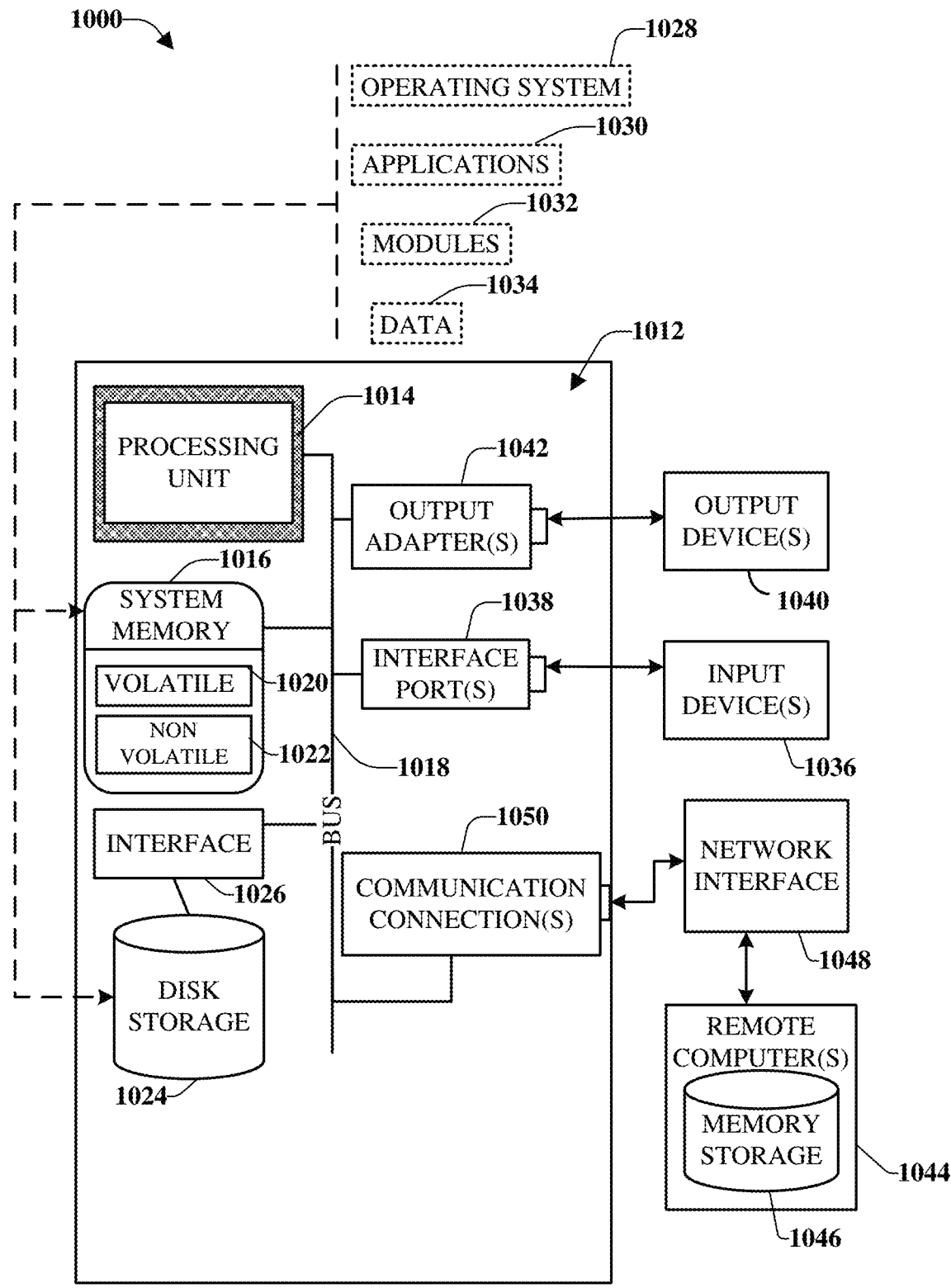
FIG. 10 illustrates a block diagram of an example, non-limiting operating environment in which one or more embodiments described herein can be facilitated.

In order to provide a context for the various aspects of the disclosed subject matter, FIG. 10 as well as the following discussion are intended to provide a general description of a suitable environment in which the various aspects of the disclosed subject matter can be implemented. FIG. 10 illustrates a block diagram of an example, non-limiting operating environment in which one or more embodiments described herein can be facilitated. Repetitive description of like elements employed in other embodiments described herein is omitted for sake of brevity. With reference to FIG. 10, a suitable operating environment 1000 for implementing various aspects of this disclosure can also include a computer 1012. The computer 1012 can also include a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014. The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1016 can also include volatile memory 1020 and nonvolatile memory 1022. The basic input/output system (BIOS), containing the basic routines to transfer information between elements within the computer 1012, such as during start-up, is stored in nonvolatile memory 1022. By way of illustration, and not limitation, nonvolatile memory 1022 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1020 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1012 can also include removable/non-removable, volatile/nonvolatile computer storage media. FIG. 10 illustrates, for example, a disk storage 1024. Disk storage 1024 can also include, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1024 to the system bus 1018, a removable or non-removable interface is typically used, such as interface 1026. FIG. 10 also depicts software that acts as an intermediary between users and the basic computer resources described in the suitable operating environment 1000. Such software can also include, for example, an operating system 1028. Operating system 1028, which can be stored on disk storage 1024, acts to control and allocate resources of the computer 1012. System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems. A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port can be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a method of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a computer, a server, a router, a network PC, a workstation, a microprocessor based appliance, a peer device or other common network node and the like, and typically can also include many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1050 refers to the hardware/software employed to connect the network interface 1048 to the system bus 1018. While communication connection 1050 is shown for illustrative clarity inside computer 1012, it can also be external to computer 1012. The hardware/software for connection to the network interface 1048 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A superconducting device, comprising:
    a first surface acoustic wave resonator comprising a first low-loss piezo-electric dielectric substrate;
    a second surface acoustic wave resonator comprising a second low-loss piezo-electric dielectric substrate;
    a Josephson ring modulator coupled to the first surface acoustic wave resonator and the second surface acoustic wave resonator, wherein the Josephson ring modulator is a dispersive nonlinear three-wave mixing element;
    a first interdigitated capacitance device positioned at a first center of the first surface acoustic wave resonator, wherein a first set of opposite nodes of the Josephson ring modulator are connected to opposite nodes of the first interdigitated capacitance device; and
    a second interdigitated capacitance device positioned at a second center of the second surface acoustic wave resonator, wherein a second set of opposite nodes of the Josephson ring modulator are connected to opposite nodes of the second interdigitated capacitance device.

2. The superconducting device of claim 1, wherein the first surface acoustic wave resonator comprises a first superconducting Bragg mirror and a second superconducting Bragg mirror separated from the first superconducting Bragg mirror by a first distance, and wherein the second surface acoustic wave resonator comprises a third superconducting Bragg mirror and a fourth superconducting Bragg mirror separated from the third superconducting Bragg mirror by a second distance, and wherein the first distance and the second distance are odd integer multiples of a half-wavelength supported by the first surface acoustic wave resonator and the second surface acoustic wave resonator.

3. The superconducting device of claim 1, wherein the first surface acoustic wave resonator is spatially and spectrally separated from the second surface acoustic wave resonator.

4. The superconducting device of claim 1, further comprising:
    a first coupling capacitor connected via a first superconducting wire to a first port of a pump; and
    a second coupling capacitor connected via a second superconducting wire to a second port of the pump, wherein the first superconducting wire and the second superconducting wire are phase matched.

5. The superconducting device of claim 1, further comprising:
    a first external feedline coupled to the first surface acoustic wave resonator through a first interdigitated capacitance device, wherein the first external feedline carries first input signals and first output signals of the first surface acoustic wave resonator; and
    a second external feedline coupled to the second surface acoustic wave resonator through a second interdigitated capacitance device, wherein the second external feedline carries second input signals and second output signals of the second surface acoustic wave resonator.

6. The superconducting device of claim 1, further comprising:
one or more external superconducting magnetic coils, wherein magnetic flux threading the Josephson ring modulator is induced through the one or more external superconducting magnetic coils.

7. The superconducting device of claim 1, wherein the first low-loss piezo-electric dielectric substrate and the second low-loss piezo-electric dielectric substrate comprise a material selected from a group of materials consisting of quartz, gallium arsenide, lithium niobite, and zinc oxide.

8. A superconducting circuit, comprising:
a Josephson ring modulator;
a first surface acoustic wave resonator coupled via a first superconducting wire to a first node of the Josephson ring modulator and via a second superconducting wire to a second node of the Josephson ring modulator, wherein the first superconducting wire and the second superconducting wire comprise a same length; and
a second surface acoustic wave resonator coupled via a third superconducting wire to a third node of the Josephson ring modulator and via a fourth superconducting wire to a fourth node of the Josephson ring modulator, wherein the third superconducting wire and the fourth superconducting wire comprise a same length, and wherein the first surface acoustic wave resonator is spatially and spectrally separated from the second surface acoustic wave resonator.

9. The superconducting circuit of claim 8, wherein the first surface acoustic wave resonator comprises a first superconducting Bragg mirror and a second superconducting Bragg mirror separated from the first superconducting Bragg mirror by a first distance, and wherein the second surface acoustic wave resonator comprises a third superconducting Bragg mirror and a fourth superconducting Bragg mirror separated from the third superconducting Bragg mirror by a second distance, and wherein the first distance and the second distance are odd integer multiples of a half-wavelength supported by the first surface acoustic wave resonator and the second surface acoustic wave resonator.

10. The superconducting circuit of claim 8, further comprising:
a first interdigitated capacitance device positioned at a first center of the first surface acoustic wave resonator, wherein a first set of opposite nodes of the Josephson ring modulator are connected to opposite nodes of the first interdigitated capacitance device; and
a second interdigitated capacitance device positioned at a second center of the second surface acoustic wave resonator, wherein a second set of opposite nodes of the Josephson ring modulator are connected to opposite nodes of the second interdigitated capacitance device.

11. The superconducting circuit of claim 8, further comprising:
a first external feedline coupled to the first surface acoustic wave resonator through a first interdigitated capacitance device, wherein the first external feedline carries first input signals and first output signals of the first surface acoustic wave resonator; and
a second external feedline coupled to the second surface acoustic wave resonator through a second interdigitated capacitance device, wherein the second external feedline carries second input signals and second output signals of the second surface acoustic wave resonator.

12. The superconducting circuit of claim 8, further comprising:
a pump port coupled to the Josephson ring modulator, wherein a pump drive is injected to the Josephson ring modulator through the pump port.

13. The superconducting circuit of claim 8, wherein the Josephson ring modulator is a dispersive nonlinear three-wave mixing element.

14. A method, comprising:
coupling a first superconducting surface acoustic wave resonator to a Josephson ring modulator;
coupling a second superconducting surface acoustic wave resonator to the Josephson ring modulator, wherein the Josephson ring modulator comprises one or more Josephson junctions arranged in a Wheatstone-bridge configuration, and wherein the Josephson ring modulator is a dispersive nonlinear three-wave mixing element;
positioning a first interdigitated capacitance device at a first center of the first superconducting surface acoustic wave resonator, wherein a first set of opposite nodes of the Josephson ring modulator are connected to opposite nodes of the first interdigitated capacitance device; and
positioning a second interdigitated capacitance device at a second center of the second superconducting surface acoustic wave resonator, wherein a second set of opposite nodes of the Josephson ring modulator are connected to opposite nodes of the second interdigitated capacitance device.

15. The method of claim 14, further comprising:
forming the first superconducting surface acoustic wave resonator comprising separating a first superconducting Bragg mirror from a second superconducting Bragg mirror by a first distance; and
forming the second superconducting surface acoustic wave resonator comprising separating a third superconducting Bragg mirror from a fourth superconducting Bragg mirror by a second distance, and wherein the first distance and the second distance are odd integer multiples of a half-wavelength supported by the first superconducting surface acoustic wave resonator and the second superconducting surface acoustic wave resonator.

16. The method of claim 14, further comprising:
coupling a first external feedline to the first superconducting surface acoustic wave resonator through a first interdigitated capacitance device, wherein the first external feedline carries first input signals and first output signals of the first superconducting surface acoustic wave resonator; and
coupling a second external feedline to the second superconducting surface acoustic wave resonator through a second interdigitated capacitance device, wherein the second external feedline carries second input signals and second output signals of the second superconducting surface acoustic wave resonator.

17. A superconducting device, comprising:
a first superconducting surface acoustic wave resonator comprising a first interdigitated capacitance device positioned at a first center of the first superconducting surface acoustic wave resonator, a first superconducting Bragg mirror and a second superconducting Bragg mirror separated from the first superconducting Bragg mirror by a first distance;
a second superconducting surface acoustic wave resonator comprising a second interdigitated capacitance device positioned at a second center of the second superconducting surface acoustic wave resonator comprises a third superconducting Bragg mirror and a fourth superconducting Bragg mirror separated from the third superconducting Bragg mirror by a second distance, wherein the first distance and the second distance are odd integer multiples of a half-wavelength supported by the first superconducting surface acoustic wave resonator and the second superconducting surface acoustic wave resonator; and a Josephson ring modulator coupled to the first superconducting surface acoustic wave resonator and the second superconducting surface acoustic wave resonator, wherein a first set of opposite nodes of the Josephson ring modulator are connected to opposite nodes of the first interdigitated capacitance device, and wherein a second set of opposite nodes of the Josephson ring modulator are connected to opposite nodes of the second interdigitated capacitance device.

18. The superconducting device of claim 17, further comprising:
a first coupling capacitor connected to a first port of a pump via a first superconducting wire comprising a first wire length; and
a second coupling capacitor connected to a second port of the pump via a second superconducting wire comprising a second wire length, wherein the first wire length and the second wire length are a same wire length.

19. The superconducting device of claim 17, wherein the first interdigitated capacitance device is connected to a first external port via a first superconducting wire and the second interdigitated capacitance device is connected to a second external port via a second superconducting wire, wherein first input signals and first output signals of the first superconducting surface acoustic wave resonator are carried over the first superconducting wire and second input signals and second output signals of the second superconducting surface acoustic wave resonator are carried over the second superconducting wire.

20. A superconducting device, comprising:
a first superconducting surface acoustic wave resonator comprising a first superconducting Bragg mirror and a second superconducting Bragg mirror separated from the first superconducting Bragg mirror by a first distance;
a second superconducting surface acoustic wave resonator comprising a third superconducting Bragg mirror and a fourth superconducting Bragg mirror separated from the third superconducting Bragg mirror by a second distance, wherein the first distance and the second distance are odd integer multiples of a half-wavelength supported by the first superconducting surface acoustic wave resonator and the second superconducting surface acoustic wave resonator, and wherein the second superconducting surface acoustic wave resonator is spatially and spectrally separated from the first superconducting surface acoustic wave resonator; and a Josephson ring modulator comprising a first set of opposite nodes and a second set of opposite nodes, the Josephson ring modulator is connected to the first superconducting surface acoustic wave resonator via the first set of opposite nodes and to the second superconducting surface acoustic wave resonator via the second set of opposite nodes.

21. The superconducting device of claim 20, further comprising:
a first interdigitated capacitance device positioned at a first center of the first superconducting surface acoustic wave resonator, wherein the first interdigitated capacitance device couples between the Josephson ring modulator and the first superconducting surface acoustic wave resonator; and
a second interdigitated capacitance device positioned at a second center of the second superconducting surface acoustic wave resonator, wherein the second interdigitated capacitance device couples between the Josephson ring modulator and the second superconducting surface acoustic wave resonator.

22. The superconducting device of claim 20, wherein the Josephson ring modulator is a dispersive nonlinear three-wave mixing element.

23. The superconducting device of claim 17, wherein the Josephson ring modulator is a dispersive nonlinear three-wave mixing element.

24. The superconducting device of claim 1, further comprising:
a pump port coupled to the Josephson ring modulator, wherein a pump drive is injected to the Josephson ring modulator through the pump port.

25. The method of claim 14, further comprising:
connecting a first coupling capacitor coupled to the Josephson ring modulator to a first port of a pump via a first superconducting wire; and
connecting a second coupling capacitor of the Josephson ring modulator to a second port of the pump via a second superconducting wire, wherein the first superconducting wire and the second superconducting wire are phase matched.

* * * * *